US010802728B2

(12) United States Patent
Lee et al.

(10) Patent No.: US 10,802,728 B2
(45) Date of Patent: Oct. 13, 2020

(54) STORAGE DEVICE AND OPERATING METHOD OF STORAGE DEVICE

(71) Applicant: SAMSUNG ELECTRONICS CO., LTD., Suwon-si, Gyeonggi-Do (KR)

(72) Inventors: Kwangwoo Lee, Seoul (KR); Chanha Kim, Hwaseong-si (KR); Yunjung Lee, Suwon-si (KR); Jisoo Kim, Seongnam-si (KR); Seungkyung Ro, Anyang-si (KR); Jinwook Lee, Seoul (KR); Heewon Lee, Seoul (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 16/416,750

(22) Filed: May 20, 2019

(65) Prior Publication Data

US 2020/0110547 A1 Apr. 9, 2020

(30) Foreign Application Priority Data

Oct. 8, 2018 (KR) .................. 10-2018-0120029

(51) Int. Cl.
*G06F 3/06* (2006.01)
*G06N 20/00* (2019.01)
*G06F 11/10* (2006.01)
*G11C 16/04* (2006.01)
*G11C 16/26* (2006.01)
*G11C 29/52* (2006.01)

(52) U.S. Cl.
CPC .......... *G06F 3/0619* (2013.01); *G06F 3/0659* (2013.01); *G06F 3/0679* (2013.01); *G06F 11/1068* (2013.01); *G06N 20/00* (2019.01); *G11C 16/0483* (2013.01); *G11C 16/26* (2013.01); *G11C 29/52* (2013.01)

(58) Field of Classification Search
CPC .. G06F 11/1068; G06F 3/0619; G06F 3/0679; G06F 3/0659; G06F 2201/82; G11C 29/52; G06N 3/08; G06N 3/084; G06N 20/00
See application file for complete search history.

(56) References Cited

U.S. PATENT DOCUMENTS

| 6,948,102 B2 | 9/2005 | Smith |
| 8,645,773 B2 | 2/2014 | Goss et al. |
| 8,995,197 B1 | 3/2015 | Steiner et al. |

(Continued)

FOREIGN PATENT DOCUMENTS

KR    10-2016-0042287    4/2016

*Primary Examiner* — Shelly A Chase
(74) *Attorney, Agent, or Firm* — F. Chau & Associates, LLC

(57) ABSTRACT

A storage device includes a nonvolatile memory device including a plurality of memory blocks, each including a plurality of memory cells connected to a plurality of word lines, and a controller configured to perform a first read operation on memory cells connected to a selected word line included in a selected memory block based on a request of an external host device. The controller is further configured to perform a check read operation that checks a reliability of the memory cells of the selected memory block after performing the first read operation. In the check read operation, the controller is further configured to select and perform one of an actual check and a machine learning-based check.

20 Claims, 19 Drawing Sheets

(56) References Cited

U.S. PATENT DOCUMENTS

| | | | |
|---|---|---|---|
| 9,164,881 B2 | 10/2015 | Seol et al. | |
| 9,170,897 B2 | 10/2015 | Losh et al. | |
| 9,406,390 B2 | 8/2016 | Kim et al. | |
| 2013/0326269 A1 | 12/2013 | Losh et al. | |
| 2018/0067697 A1 | 3/2018 | Lee et al. | |
| 2018/0108422 A1 | 4/2018 | Oh et al. | |
| 2018/0143762 A1 | 5/2018 | Kim et al. | |
| 2019/0095299 A1* | 3/2019 | Liu | G06F 11/2257 |
| 2019/0385094 A1* | 12/2019 | Alex | G11B 20/1833 |
| 2020/0004439 A1* | 1/2020 | Borlick | G06N 3/084 |

* cited by examiner

STORAGE DEVICE AND OPERATING METHOD OF STORAGE DEVICE

CROSS-REFERENCE TO RELATED APPLICATIONS

This application claims priority under 35 U.S.C. § 119 to Korean Patent Application No. 10-2018-0120029 filed on Oct. 8, 2018 in the Korean Intellectual Property Office, the disclosure of which is incorporated by reference herein in its entirety.

TECHNICAL FIELD

Exemplary embodiments of the inventive concept relate to a semiconductor device, and more particularly, to a storage device that performs a reliability check by using machine learning, and an operating method of the storage device.

DISCUSSION OF THE RELATED ART

A storage device stores data under control of a host device, such as a computer, a smartphone, a tablet computer, etc. The storage device may be a device that stores data on a magnetic disk such as a hard disk drive (HDD), or a device that stores data in a semiconductor memory, in particular, a nonvolatile memory, such as a solid state drive (SSD) or a memory card.

A nonvolatile memory device includes, for example, a read only memory (ROM), a programmable ROM (PROM), an electrically programmable ROM (EPROM), an electrically erasable and programmable ROM (EEPROM), a flash memory, a phase-change random access memory (PRAM), a magnetic RAM (MRAM), a resistive RAM (RRAM), a ferroelectric RAM (FRAM), etc.

The degree of integration of the storage device and a volume thereof continue to increase as semiconductor manufacturing technologies advance. The high degree of integration of the storage device makes it possible to reduce costs necessary to manufacture the storage device. However, the high degree of integration of the storage device results in the storage device having to be scaled down, as well as structural changes of the storage device. As a result, various new issues may arise. Such issues may cause damage of data stored in the storage device, thereby lowering the reliability of the storage device.

SUMMARY

Exemplary embodiments of the inventive concept provide a storage device that performs a reliability check within a short time by using machine learning, and an operating method of the storage device.

According to an exemplary embodiment, a storage device includes a nonvolatile memory device including a plurality of memory blocks, each including a plurality of memory cells connected to a plurality of word lines, and a controller configured to perform a first read operation on memory cells connected to a selected word line included in a selected memory block based on a request of an external host device. The controller is further configured to perform a check read operation that checks a reliability of the memory cells of the selected memory block after performing the first read operation. In the check read operation, the controller is further configured to select and perform one of an actual check and a machine learning-based check.

According to an exemplary embodiment, a storage device includes a nonvolatile memory device including a plurality of memory blocks, each including a plurality of memory cells connected to a plurality of word lines, and a controller configured to perform a read operation on memory cells connected to a selected word line included in a selected memory block based on a request of an external host device. The controller is further configured to perform a check read operation that checks a reliability of the memory cells of the selected memory block after performing the first read operation. In the check read operation, the controller performs an actual check on first check target word lines in the selected memory block and performs a machine learning-based check on second check target word lines in the selected memory block.

According to an exemplary embodiment, an operating method of a storage device, which includes a nonvolatile memory device and a controller configured to control the nonvolatile memory device, includes selecting a word line of a memory block from a plurality of memory blocks included in the nonvolatile memory device, performing, at the controller, a read operation on a plurality of memory cells connected to the selected word line, and performing, at the controller, a check read operation on memory cells connected to at least one check target word line of the memory block connected to the selected word line in response to the read operation. The check read operation combines an actual check and a machine learning-based check on the memory cells connected to the at least one check target word line.

BRIEF DESCRIPTION OF THE DRAWINGS

The above and other features of the inventive concept will become more apparent by describing in detail exemplary embodiments thereof with reference to the accompanying drawings, in which.

DETAILED DESCRIPTION

Figure 1:
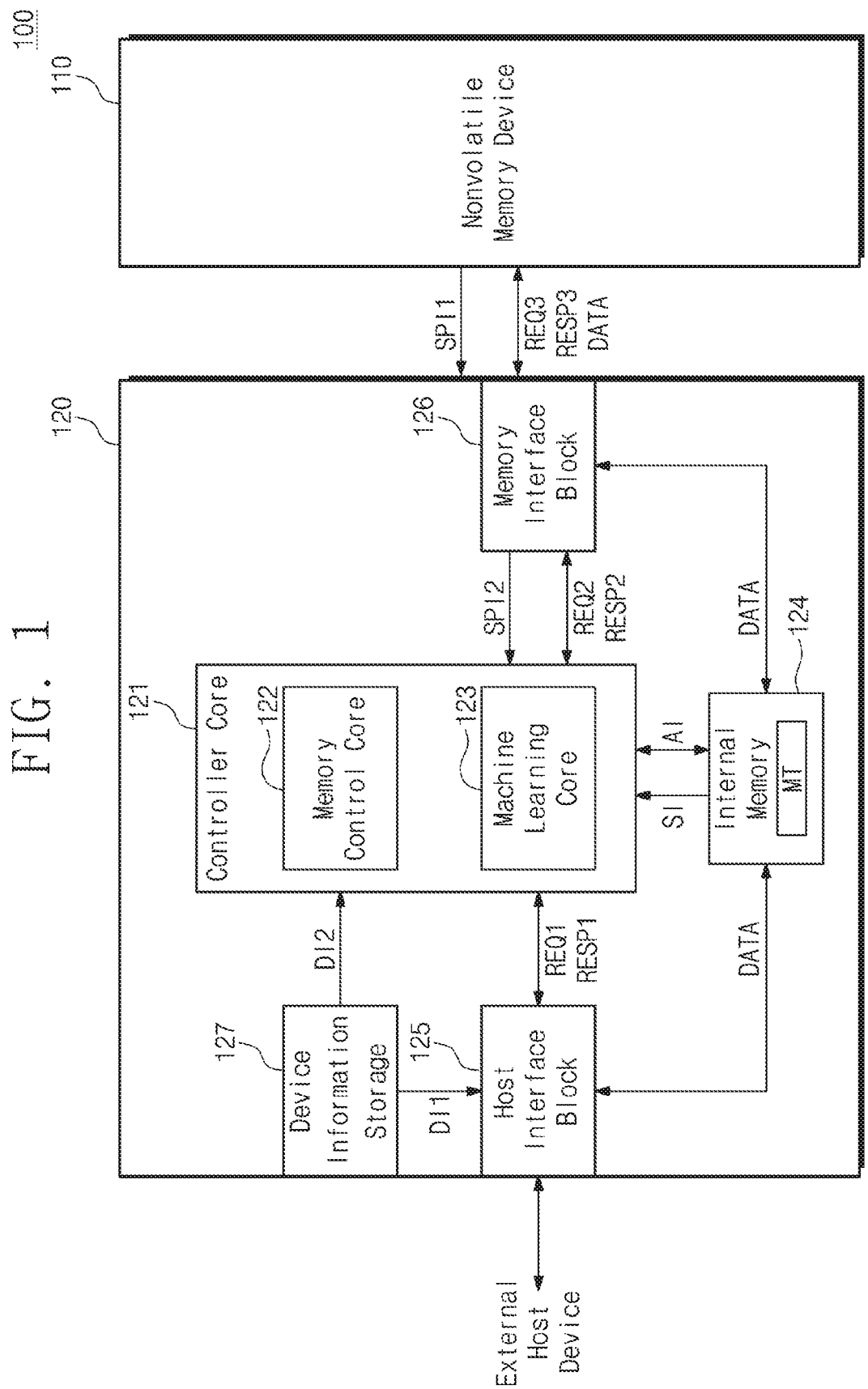
FIG. 1 is a block diagram illustrating a storage device according to an exemplary embodiment of the inventive concept.

Exemplary embodiments of the inventive concept will be described more fully hereinafter with reference to the accompanying drawings. Like reference numerals may refer to like elements throughout the accompanying drawings.

It will be understood that the terms "first," "second," "third," etc. are used herein to distinguish one element from another, and the elements are not limited by these terms. Thus, a "first" element in an exemplary embodiment may be described as a "second" element in another exemplary embodiment.

It should be understood that descriptions of features or aspects within each exemplary embodiment should typically be considered as available for other similar features or aspects in other exemplary embodiments, unless the context clearly indicates otherwise.

FIG. 1 is a block diagram illustrating a storage device 100 according to an exemplary embodiment of the inventive concept.

Referring to FIG. 1, the storage device 100 includes a nonvolatile memory device 110 and a controller 120. The controller 120 may also be referred to herein as a controller circuit. The nonvolatile memory device 110 may perform a write operation, a read operation, or an erase operation under control of the controller 120.

Even when power is turned off, the nonvolatile memory device 110 may retain data written before the power is turned off. The nonvolatile memory device 110 may include, for example, a phase change memory device, a magnetic memory, a resistive memory, a ferroelectric memory, a flash memory, etc.

The controller 120 may control the nonvolatile memory device 110 depending on a request of an external host device or an internally designated schedule. The controller 120 may include a controller core 121, an internal memory 124, a host interface block 125, a memory interface block 126, and device information storage 127.

The controller core 121 may include a memory control core 122 and a machine learning core 123. The memory control core 122 may control and access the nonvolatile memory device 110 depending on a request of the external host device or an internally designated schedule. The memory control core 122 may manage and execute various metadata and codes used to manage or operate the storage device 100.

The machine learning core 123 may be used to check the reliability of data stored in the nonvolatile memory device 110. For example, the machine learning core 123 may collect various information of the storage device 100, and may perform a machine learning-based check for determining the expected reliability of data stored in the nonvolatile memory device 110 based on the collected information.

The internal memory 124 may be used as a system memory which is used by the controller core 121, a cache memory which stores data of the nonvolatile memory device 110, or a buffer memory which temporarily stores data between the external host device and the nonvolatile memory device 110. The internal memory 124 may store a mapping table MT that indicates a relationship between logical addresses assigned to the storage device 100 and physical addresses of the nonvolatile memory device 110. The internal memory 124 may include, for example, a DRAM or an SRAM.

The host interface block 125 may include a component for communicating with the external host device such as, for example, a physical block. The memory interface block 126 may include a component for communicating with the nonvolatile memory device 110 such as, for example, a physical block.

The device information storage 127 may store information about manufacturing the storage device 100. For example, the device information storage 127 may store first device information DI1 to be provided to the external host device, and second device information DI2 to be provided to the machine learning core 123. The device information storage 127 may include, for example, a ROM.

Below, an operation of the storage device 100 over time will be described. When power is supplied to the storage device 100, the device information storage 127 may transmit the first device information DI1 to the external host device through the host interface block 125. Based on the first device information DI1, the storage device 100 may perform initialization with the external host device.

The host interface block 125 may provide the memory control core 122 with a first request REQ1 received from the external host device. The first request REQ1 may include a command (e.g., a read command or a write command) and a logical address. The memory control core 122 may translate the first request REQ1 to a second request REQ2 suitable for the nonvolatile memory device 110.

For example, the memory control core 122 may translate a format of the command. The memory control core 122 may obtain address information AI with reference to the mapping table MT stored in the internal memory 124. The memory control core 122 may translate a logical address to a physical address of the nonvolatile memory device 110 by using the address information AI. The memory control core 122 may provide the second request REQ2 suitable for the nonvolatile memory device 110 to the memory interface block 126.

The memory interface block 126 may register the second request REQ2 from the memory control core 122 at a queue. The memory interface block 126 may transmit a request that is first registered at the queue to the nonvolatile memory device 110 as a third request REQ3.

When the first request REQ1 is a write request, the host interface block 125 may write data received from the external host device to the internal memory 124. When the third request REQ3 is a write request, the memory interface block 126 may transmit data stored in the internal memory 124 to the nonvolatile memory device 110.

When data are completely written, the nonvolatile memory device 110 may transmit a third response RESP3 to the memory interface block 126. In response to the third response RESP3, the memory interface block 126 may provide the memory control core 122 with a second response RESP2 indicating that the data are completely written.

After the data are stored in the internal memory 124 or after the second response RESP2 is received, the memory control core 122 may transmit a first response RESP1 indicating that the request is completed to the external host device through the host interface block 125.

When the first request REQ1 is a read request, the read request may be transmitted to the nonvolatile memory device 110 through the second request REQ2 and the third request REQ3. The memory interface block 126 may store data received from the nonvolatile memory device 110 in the internal memory 124. When data are completely transmitted, the nonvolatile memory device 110 may transmit the third response RESP3 to the memory interface block 126.

As the third response RESP3 is received, the memory interface block 126 may provide the memory control core 122 with the second response RESP2 indicating that the data are completely stored. As the second response RESP2 is received, the memory control core 122 may transmit the first response RESP1 to the external host device through the host interface block 125.

The host interface block 125 may transmit data stored in the internal memory 124 to the external host device. In an exemplary embodiment, in the case in which data corresponding to the first request REQ1 are stored in the internal memory 124, the transmission of the second request REQ2 and the third request REQ3 may be omitted.

When a condition of a machine learning-based check is satisfied, the memory control core 122 may provide the memory interface block 126 with the second request REQ2 requesting a sample read operation. The memory interface block 126 may transmit the third request REQ3 requesting the sample read operation to the nonvolatile memory device 110.

For example, the memory interface block 126 may process a request after registering the request at the queue, or may process the request immediately without registering the request at the queue. The memory control core 122 may direct the machine learning core 123 to perform the machine learning-based check.

The nonvolatile memory device 110 may perform the sample read operation and may transmit a result of the sample read operation to the memory interface block 126 as first sample information SPI1. The memory interface block 126 may provide the received first sample information SPI1 to the machine learning core 123 as second sample information SPI2.

The machine learning core 123 may collect state information SI from the internal memory 124. The state information SI may include information about a state of the nonvolatile memory device 110 or the storage device 100. The state information SI may be meta information which is managed in the internal memory 124 together with the mapping table MT.

The machine learning core 123 may collect the second device information DI2 from the device information storage 127. The machine learning core 123 may perform a machine learning-based expectation determination based on the second sample information SPI2, the state information SI, and the second device information DI2. For example, the machine learning core 123 may determine the expected number of errors of memory cells on which the sample read operation is performed.

The machine learning core 123 may be organized based on a trained machine learning model. For example, the trained machine learning model(s) may be stored in the nonvolatile memory device 110. The machine learning core 123 may load and organize the machine learning models (or an appropriate model of models) stored in the nonvolatile memory device 110.

Figure 2:
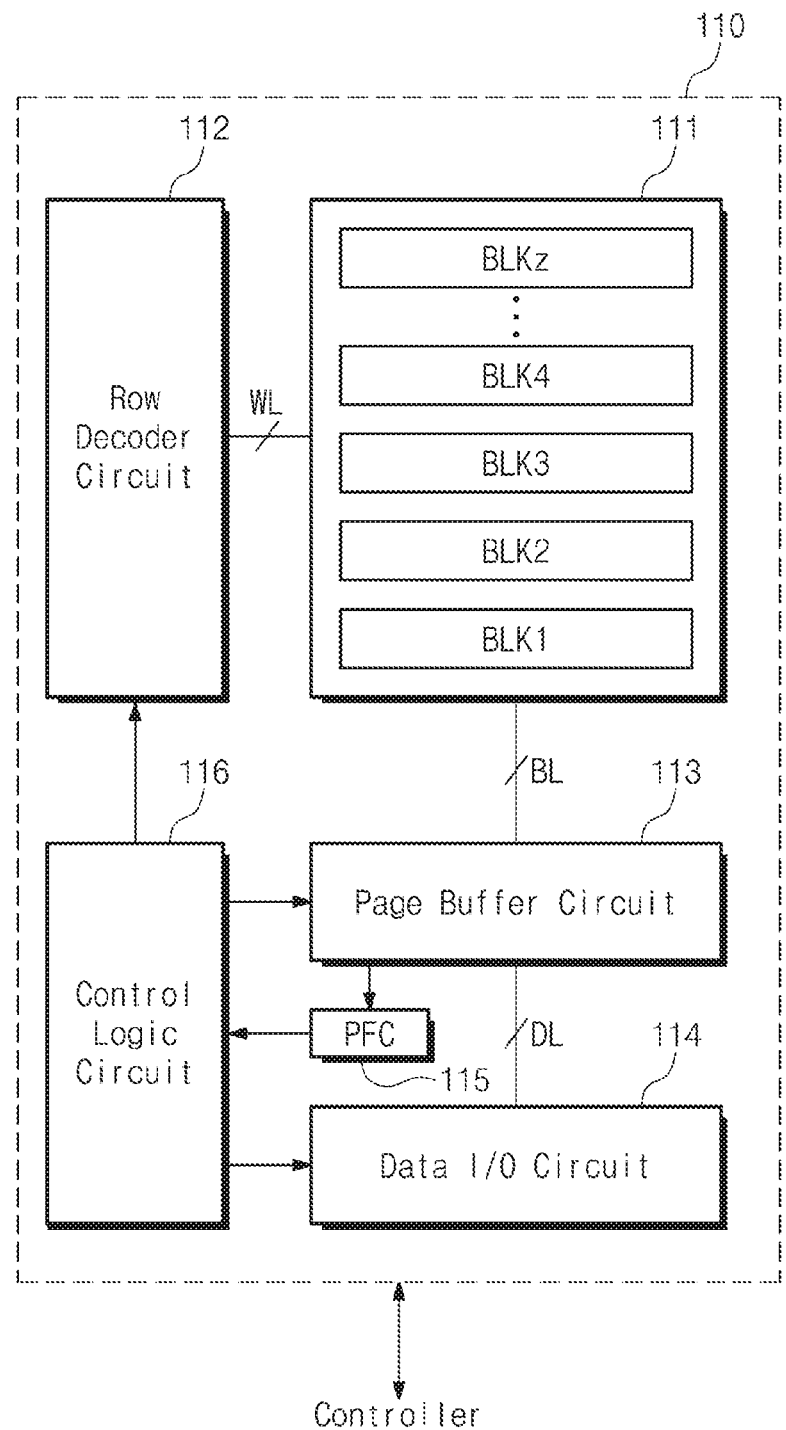
FIG. 2 is a block diagram illustrating a nonvolatile memory device according to an exemplary embodiment of the inventive concept.

FIG. 2 is a block diagram illustrating the nonvolatile memory device 110 according to an exemplary embodiment of the inventive concept.

Referring to FIGS. 1 and 2, in an exemplary embodiment, the nonvolatile memory device 110 includes a memory cell array 111, a row decoder circuit 112, a page buffer circuit 113, a data input/output circuit 114, a pass-fail check (PFC) circuit 115, and a control logic circuit 116.

The memory cell array 111 includes a plurality of memory blocks BLK1 to BLKz. In FIG. 2, z is an integer equal to at least 5. However, the value of z is not limited thereto. Each of the memory blocks BLK1 to BLKz may include a plurality of memory cells. Each of the memory blocks BLK1 to BLKz may be connected to the row decoder circuit 112 through word lines WL.

Each of the memory blocks BLK1 to BLKz may be connected to the page buffer circuit 113 through a plurality of bit lines BL. The plurality of memory blocks BLK1 to BLKz may be connected in common to the plurality of bit lines BL. The memory cells of the plurality of memory blocks BLK1 to BLKz may have the same structure.

In an exemplary embodiment, each of the memory blocks BLK1 to BLKz may correspond to a unit of the erase operation. The memory cells of the memory cell array 111 may be erased for each memory block. The memory cells belonging to one memory block may be erased at the same time. In an exemplary embodiment, each memory block may be divided into a plurality of sub-blocks. Each of the plurality of sub-blocks may be a unit of the erase operation.

The row decoder circuit 112 is connected to the memory cell array 111 through the word lines WL. The row decoder circuit 112 operates under control of the control logic circuit 116. The row decoder circuit 112 may decode an address received from the controller 120 through a first channel (e.g., an input/output channel), and may control voltages to be applied to the word lines WL depending on the decoded address.

The page buffer circuit 113 is connected to the memory cell array 111 through the plurality of bit lines BL. The page buffer circuit 113 is connected with the data input/output circuit 114 through a plurality of data lines DL. The page buffer circuit 113 operates under control of the control logic circuit 116.

In the write operation, the page buffer circuit 113 may store data to be written to memory cells. The page buffer circuit 113 may apply voltages to the plurality of bit lines BL based on the stored data. In the read operation or a verification read operation associated with the write or erase operation, the page buffer circuit 113 may sense voltages of the bit lines BL and may store a result of the sensing.

The data input/output circuit 114 is connected with the page buffer circuit 113 through the plurality of data lines DL. The data input/output circuit 114 may output data read by the page buffer circuit 113 to the controller 120 through the first channel, and may provide data received from the controller 120 through the first channel to the page buffer circuit 113.

After the verification read operation associated with the write operation or the erase operation, the pass-fail check circuit (PFC) 115 may receive the sensing result from the page buffer circuit 113. The pass-fail check (PFC) circuit 115 may count the number of on-cells or off-cells from the received sensing result. The pass-fail check (PFC) circuit 115 may determine a pass or a fail depending on the counted value. A result of the determination is provided to the control logic circuit 116.

The control logic circuit 116 may receive a command through the first channel from the controller 120, and may receive a control signal through a second channel (e.g., a control channel) from the controller 120. The control logic circuit 116 may receive the command input through the first channel in response to the control signal, may route an address received through the second channel to the row decoder circuit 112, and may route data received through the first channel to the data input/output circuit 114.

The control logic circuit 116 may decode the received command and may control the nonvolatile memory device 110 depending on the decoded command. In the verification read operation associated with the write operation or the erase operation, the control logic circuit 116 may receive the pass or fail determination result from the pass-fail check (PFC) circuit 115.

Figure 3:
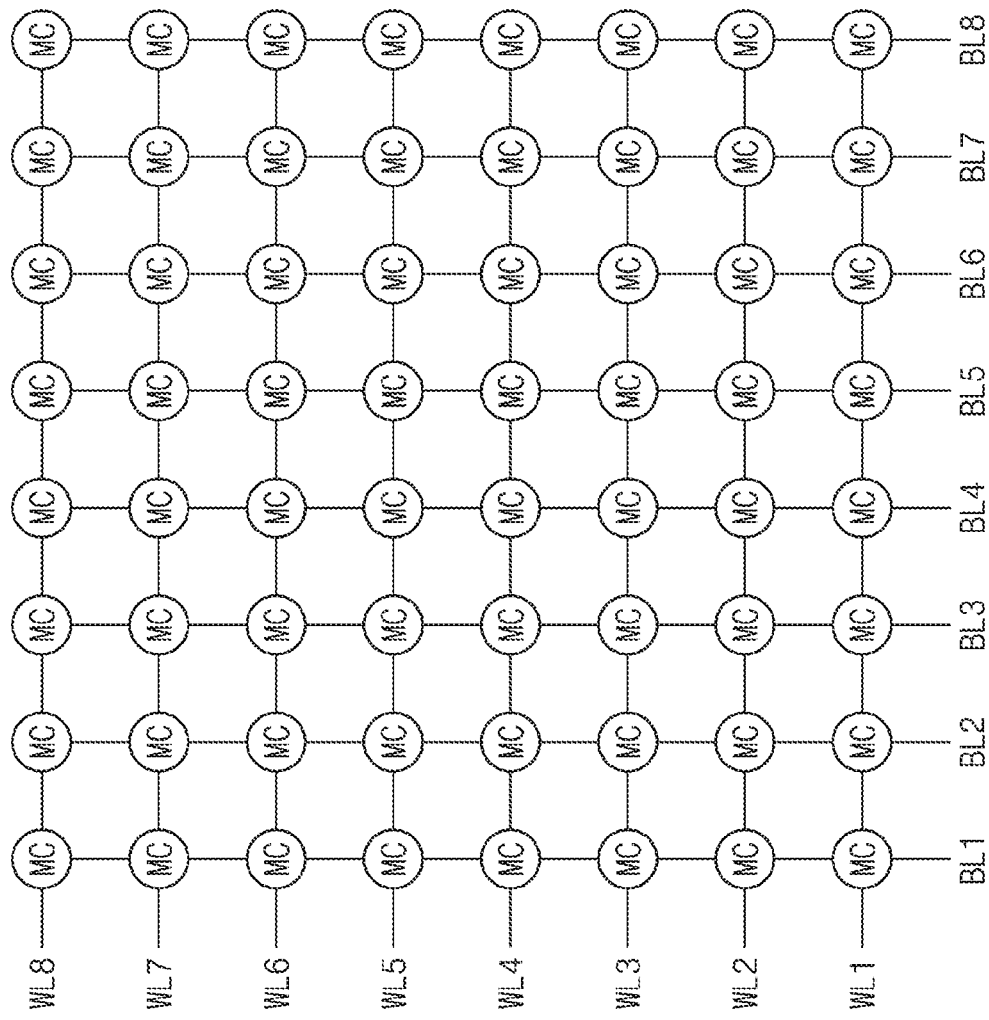
FIG. 3 is a diagram illustrating a first memory block according to an exemplary embodiment of the inventive concept.

FIG. 3 is a diagram illustrating a first memory block BLK1 according to an exemplary embodiment of the inventive concept.

Referring to FIGS. 2 and 3, the first memory block BLK1 may include a plurality of memory cells MC arranged in rows and columns. The memory cells MC in the rows may be connected to word lines, for example, first to eighth word lines WL1 to WL8. The memory cells MC in the columns may be connected to bit lines, for example, first to eighth bit lines BL1 to BL8.

In an exemplary embodiment, selection transistors for selectively controlling the memory cells MC may be provided in the first memory block BLK1. The selection transistors may be controlled by voltages of selection lines. The voltages of the selection lines may be controlled by the row decoder circuit 112.

In an exemplary embodiment, the memory cells MC may be transistors, the threshold voltages of which are variable by the write operation or the erase operation. When the write operation is performed, threshold voltages of the memory cells MC targeted for the write operation may increase. When the erase operation is performed, threshold voltages of the memory cells MC targeted for the erase operation may decrease. The memory cells MC may be flash memory cells. The memory block BLK1 may have a structure of the NAND flash memory.

Memory cells connected to one of the first to eighth word lines WL1 to WL8 may correspond to one page. A page may be a unit of the write operation and the read operation. In an exemplary embodiment, each of the memory blocks BLK1 to BLKz may have the same structure as illustrated in FIG. 3.

Figure 4:
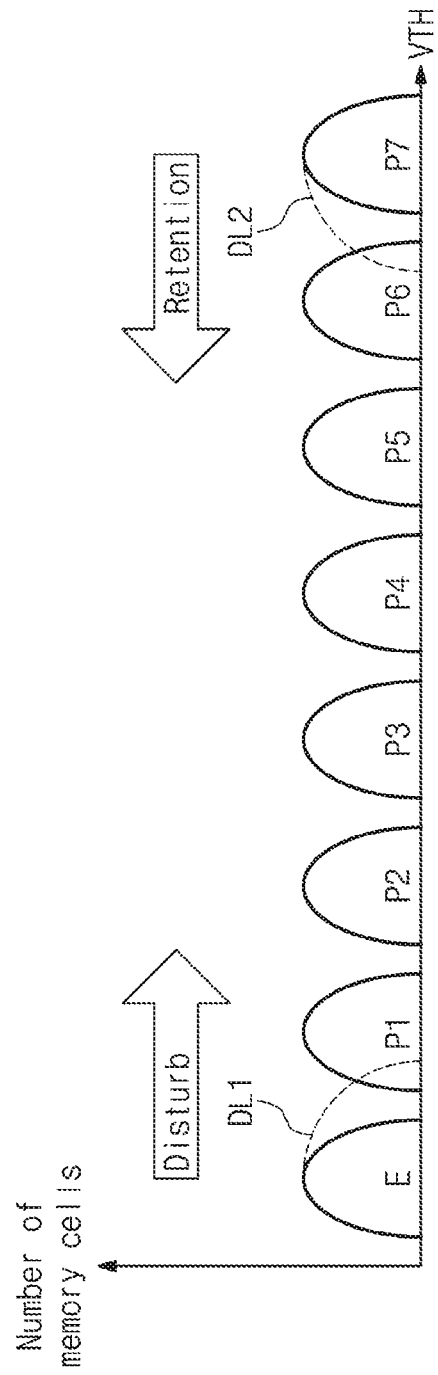
FIG. 4 is a diagram illustrating an example of threshold voltages when data are written to memory cells illustrated in FIG. 3.

FIG. 4 is a diagram illustrating an example of threshold voltages VTH when data are written to the memory cells MC illustrated in FIG. 3.

In FIG. 4, the horizontal axis represents a threshold voltage VTH, and the vertical axis represents the number of memory cells. Referring to FIGS. 2 and 4, each of the memory cells MC may have one of an erase state E and first to seventh program states P1 to P7. Each state may correspond to a distribution range of the threshold voltages VTH of the memory cells MC.

The states illustrated in FIG. 4 show an example in which three bits are written to one memory cell. When n bits (n being a positive integer) are written to one memory cell, the memory cells MC may have $2^n$ states.

After data are written to the memory cells MC, states of the memory cells MC may be distinguished from each other as illustrated in FIG. 4 by a solid line. Due to various factors after data are written to the memory cells MC, the states of the memory cells MC may intrude into ranges of any other states (hereinafter referred to as "state intrusion"), as illustrated in FIG. 4 by a dotted line.

For example, referring to a first dotted line DL1, a threshold voltage of a memory cell having the erase state E may intrude into a range of the first program state P1. The intrusion may occur when the read operation is performed on memory cells (e.g., memory cells connected to an adjacent different word line) adjacent to the memory cell of the erase state E. This phenomenon may be referred to as "disturb". For example, when a read operation is performed on selected memory cells, disturb may occur at memory cells adjacent to the selected memory cells.

Alternatively, referring to a second dotted line DL2, a threshold voltage of a memory cell having the seventh program state P7 may intrude into a range of the sixth program state P6. This intrusion may occur when the memory cell of the seventh program state P7 is left alone. This phenomenon may be referred to as "deterioration of retention."

The disturb described with reference to the erase state E and the deterioration of retention described with reference to the seventh program state P7 may occur even at memory cells of the first to sixth program states P1 to P6. When the state intrusion occurs, data written to the memory cells MC are lost. The loss of data causes a decrease in reliability of the storage device 100 and the nonvolatile memory device 110.

To prevent this issue or to reduce the likelihood that this issue occurs, the storage device 100 according to an exemplary embodiment of the inventive concept may perform a check read operation following the read operation. The check read operation may be used to check whether the reliability of data written to the memory cells MC decreases due to various factors such as, for example, the disturb phenomenon and the deterioration of retention phenomenon.

For example, the storage device 100 according to an exemplary embodiment of the inventive concept may combine an actual check that directly and actually checks the reliability of data written to the memory cells MC, and a machine learning-based check that determines the expected reliability based on machine learning. For example, in the actual check, actual data from the memory cells targeted for a check is read, and the actual number of errors is detected from the actually read data. That is, the result of the actual check reflects the number of errors that are actually present in the targeted memory cells. In contrast, in the machine learning-based check, collected information is used to determine the expected number of errors in the memory cells targeted for a check (without determining the actual number of errors).

A result of the actual check has relatively high reliability compared to the machine learning-based check, but a relatively long time is taken to perform the actual check compared to the machine learning-based check. A result of the machine learning-based check has relatively low reliability compared to the actual check, but a relatively short time is taken to perform the machine learning-based check compared to the actual check.

Exemplary embodiments of the inventive concept combine the actual check and the machine learning-based check. By combining the actual check and the machine learning-based check, the storage device 100 according to an exemplary embodiment of the inventive concept may form, maintain, and control the balance between the reliability and the necessary time of the check read operation. That is, exemplary embodiments of the inventive concept provide a device and a method for combining the actual check and the machine learning-based check to achieve a compromise between the check time and the check accuracy.

Figure 5:
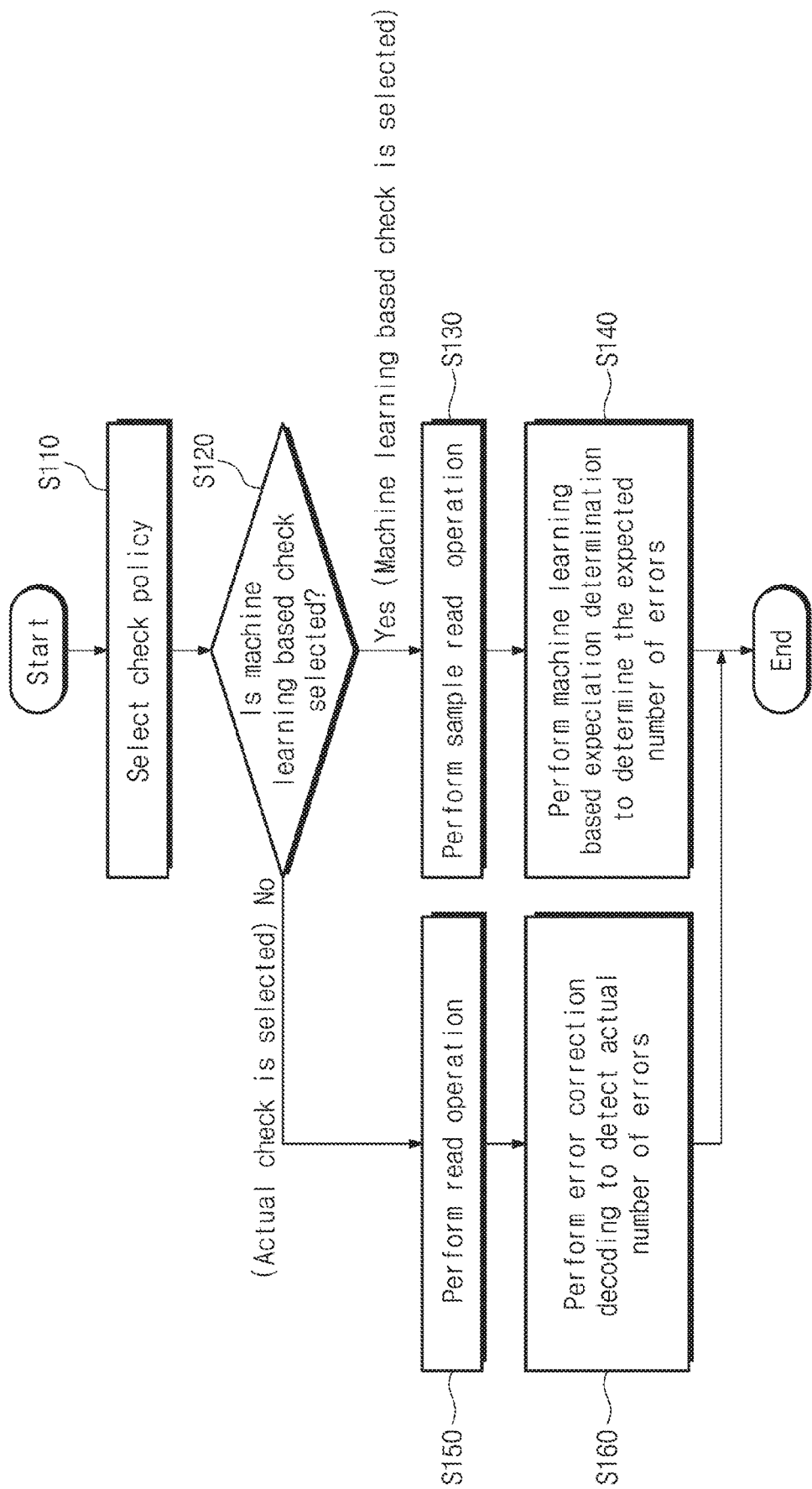
FIG. 5 is a flowchart illustrating an example of a check read operation according to an exemplary embodiment of the inventive concept.

FIG. 5 is a flowchart illustrating an example of a check read operation according to an exemplary embodiment of the inventive concept.

Referring to FIGS. 1 and 5, in operation S110, the memory control core 122 may select a check policy. For example, the memory control core 122 may select whether to perform the actual check or whether to perform the machine learning-based check.

When the machine learning-based check is selected in operation S120, operation S130 is performed. In operation S130, the storage device 100 may perform the sample read operation. For example, the memory control core 122 may direct the sample read operation to the nonvolatile memory device 110 through the memory interface block 126. Also, the memory control core 122 may direct the machine learning-based expectation determination to the machine learning core 123.

The nonvolatile memory device 110 may perform the sample read operation on memory cells targeted for a check. The word line to which the memory cells targeted for a check are connected may be referred to as a check target word line. In an exemplary embodiment, in the check read operation, the controller 120 performs the actual check on first check target word lines in a selected memory block and performs the machine learning-based check on second check target word lines in the selected memory block. When the number of expected errors with regard to one of the second check target word lines is equal to at least a threshold value, the controller 120 further performs the actual check on the one second check target word line, as described in further detail below. The controller 120 may further adjust a number of the first check target word lines and a number of the second check target word lines based on the number of expected errors from the one second check target word line and a number of actual errors detected from the one second check target word line through the actual check, as described in further detail below. The nonvolatile memory device 110 may provide a result of the sample read operation as the first sample information SPI1 to the controller core 121, for example, the machine learning core 123.

In operation S140, the machine learning core 123 may determine the expected number of errors by performing the machine learning-based expectation determination. The machine learning core 123 may perform the machine learning-based expectation determination based on the second sample information SPI2, the second device information DI2, and the state information SI. The machine learning core 123 may determine the expected number of errors of memory cells on which the sample read operation is performed. For example, the machine learning core 123 may determine the expected number of errors based on machine learning by using a result of the sample read operation and information of the storage device 100. The machine learning core 123 may provide the determined expected number of errors to the memory control core 122.

When the actual check is selected in operation S120, operation S150 is performed. In operation S150, the storage device 100 may perform the read operation. For example, the memory control core 122 may direct the read operation to the nonvolatile memory device 110 through the memory interface block 126.

The nonvolatile memory device 110 may perform the read operation on memory cells targeted for a check. The word line to which the memory cells targeted for a check are connected may be referred to as a check target word line. The nonvolatile memory device 110 may provide a result of the read operation to the memory interface block 126 as data DATA (see FIG. 1).

In operation S160, the memory interface block 126 may perform error correction decoding on the received data DATA. When the error correction decoding is performed, the memory interface block 126 may detect the number of errors from the received data DATA. The memory interface block 126 may report the detected number of errors to the memory control core 122.

The memory control core 122 may obtain the number of errors detected through the actual check or the number of errors expected through the machine learning-based check. The memory control core 122 may evaluate the reliability of data written to the nonvolatile memory device 110 by using the actual detected number of errors and/or the expected number of errors.

When the reliability of the memory block on which the check read operation is performed is low, the memory control core 122 may perform a refresh operation on the memory block. The refresh operation may include a reclaim operation in which valid data of the memory block are written to any other memory block. Since data are newly written when the refresh operation is performed, the reliability of data is recovered.

Figure 6:
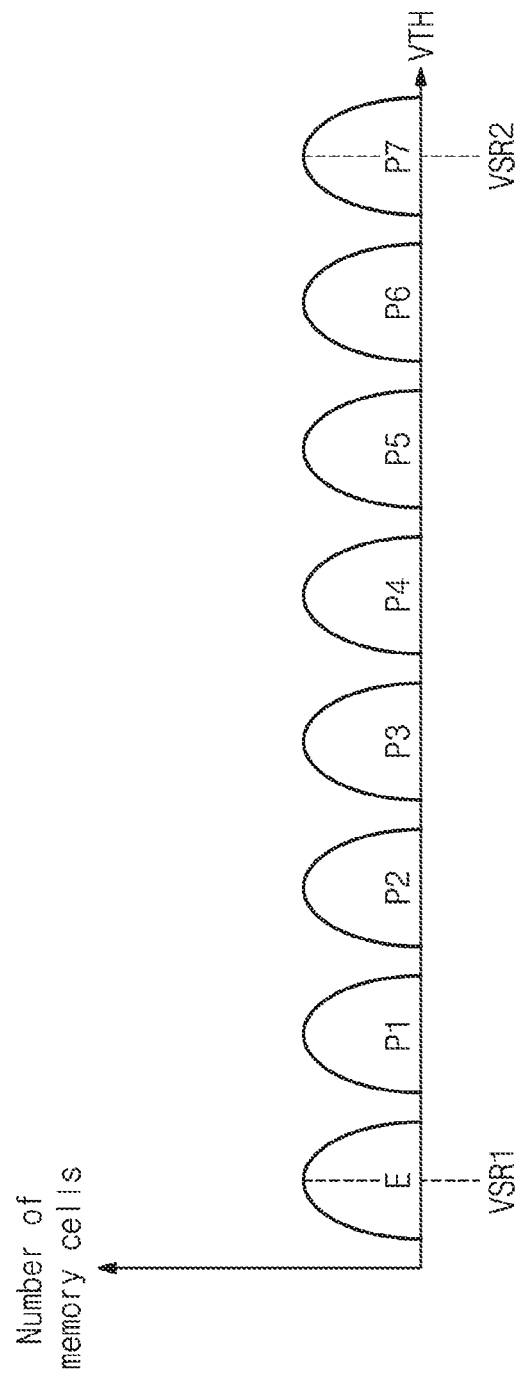
FIG. 6 is a diagram illustrating an example in which a sample read operation is performed on memory cells targeted for a check.

FIG. 6 is a diagram illustrating an example in which a sample read operation is performed on memory cells targeted for a check.

In FIG. 6, the horizontal axis represents a threshold voltage VTH, and the vertical axis represents the number of memory cells.

Referring to FIGS. 1, 2, and 6, the sample read operation may be performed by using a first sample read voltage VSR1 and a second sample read voltage VSR2. The first sample read voltage VSR1 may have a level corresponding to the center of a range of the erase state E when data written to the memory cells MC do not deteriorate.

The row decoder circuit 112 may apply the first sample read voltage VSR1 to a word line connected to memory cells targeted for a check. The page buffer circuit 113 may sense memory cells turned on or turned off by the first sample read voltage VSR1.

The second sample read voltage VSR2 may have a level corresponding to the center of a range of the seventh program state P7 when data written to the memory cells MC do not deteriorate. The row decoder circuit 112 may apply the second sample read voltage VSR2 to the word line connected to the memory cells targeted for a check. The page buffer circuit 113 may sense memory cells turned on or turned off by the second sample read voltage VSR2.

A result of the sample read operation may be provided to the machine learning core 123 as the second sample information SPI2. In an exemplary embodiment, the nonvolatile memory device 110 may count the number of memory cells turned on or turned off by the first sample read voltage VSR1 or the second sample read voltage VSR2. A result of the counting may be provided to the machine learning core 123 as the second sample information SPI2.

Figure 7:
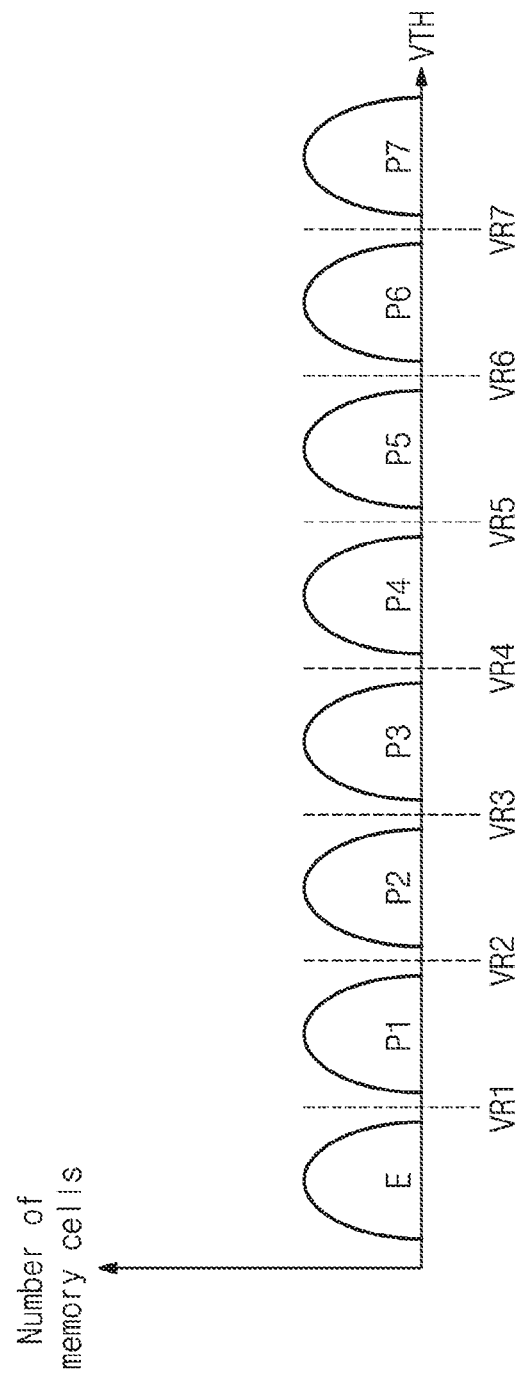
FIG. 7 is a diagram illustrating an example in which a read operation is performed on memory cells targeted for a check.

FIG. 7 is a diagram illustrating an example in which a read operation is performed on memory cells targeted for a check.

In FIG. 7, the horizontal axis represents a threshold voltage VTH, and the vertical axis represents the number of memory cells.

Referring to FIGS. 1, 2, and 7, the sample read operation may be performed by using first to seventh read voltages VR1 to VR7. The first to seventh read voltages VR1 to VR7 may have levels between ranges of the first to seventh program states P1 to P7.

The row decoder circuit 112 may apply the first to seventh read voltages VR1 to VR7 to a word line connected to memory cells targeted for a check. The page buffer circuit 113 may sense memory cells turned on or turned off by the first to seventh read voltages VR1 to VR7.

Depending on a result of the determination, the page buffer circuit 113 may identify states of the memory cells and may read data stored in the memory cells. The nonvolatile memory device 110 may provide the data read from the memory cells to the memory interface block 126 as the first sample information SPI1.

The memory interface block 126 may detect the number of errors from data of the first sample information SPI1. The memory interface block 126 may provide the detected number of errors to the machine learning core 123 as the second sample information SPI2.

Figure 8:
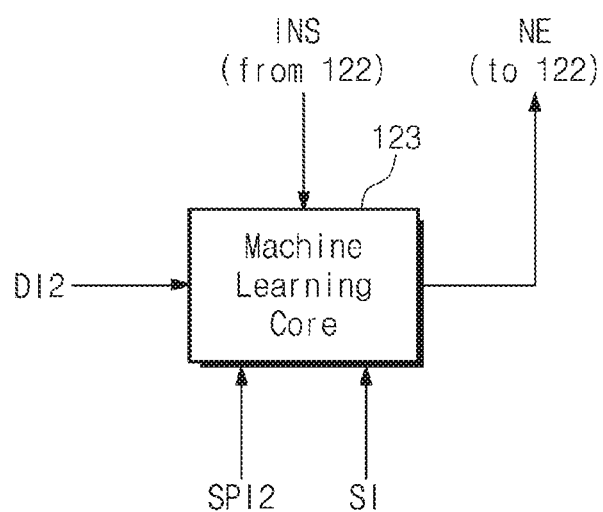
FIG. 8 is a diagram illustrating an example of pieces of information about a machine learning core.

FIG. 8 is a diagram illustrating an example of pieces of information about the machine learning core 123.

Referring to FIGS. 1 and 8, the machine learning core 123 may perform a machine learning-based expectation determination depending on an instruction INS received from the memory control core 122. For the machine learning-based expectation determination, the machine learning core 123 may receive the second device information DI2, the state information SI, and the second sample information SPI2.

The second device information DI2 may include information which is decided upon manufacturing the nonvolatile memory device 110 such as, for example, a location of the nonvolatile memory device 110 on a wafer, a location at which the nonvolatile memory device 110 is manufactured, a structural characteristic of the nonvolatile memory device 110, a model/type of the nonvolatile memory device 110, and a type of process used when manufacturing the nonvolatile memory device 110.

The state information SI may include information which is changed due to the use of the nonvolatile memory device 110 such as, for example, an address of a memory block selected as a check target, the number of times that the memory block selected as the check target is erased, an address of a word line selected as a check target (e.g., the check target word line), a time that elapses after memory cells connected to the word line selected as the check target are programmed, the number of read operations previously performed on the selected memory block, a time/duration that the selected memory block is left alone in an erase state before the selected memory block is programmed, a current temperature, and a current humidity.

The machine learning core 123 may determine the expected number of errors of data stored in the memory cells connected to the word line selected as the check target based on the second device information DI2, the state information SI, and the second sample information SPI2. The machine learning core 123 may provide a value NE indicating the expected number of errors to the memory control core 122.

For example, expectation models which are executed by the machine learning core 123 may be stored in the nonvolatile memory device 110. The machine learning core 123 may select one of the expectation models stored in the nonvolatile memory device 110 based on machine learning.

Figure 9:
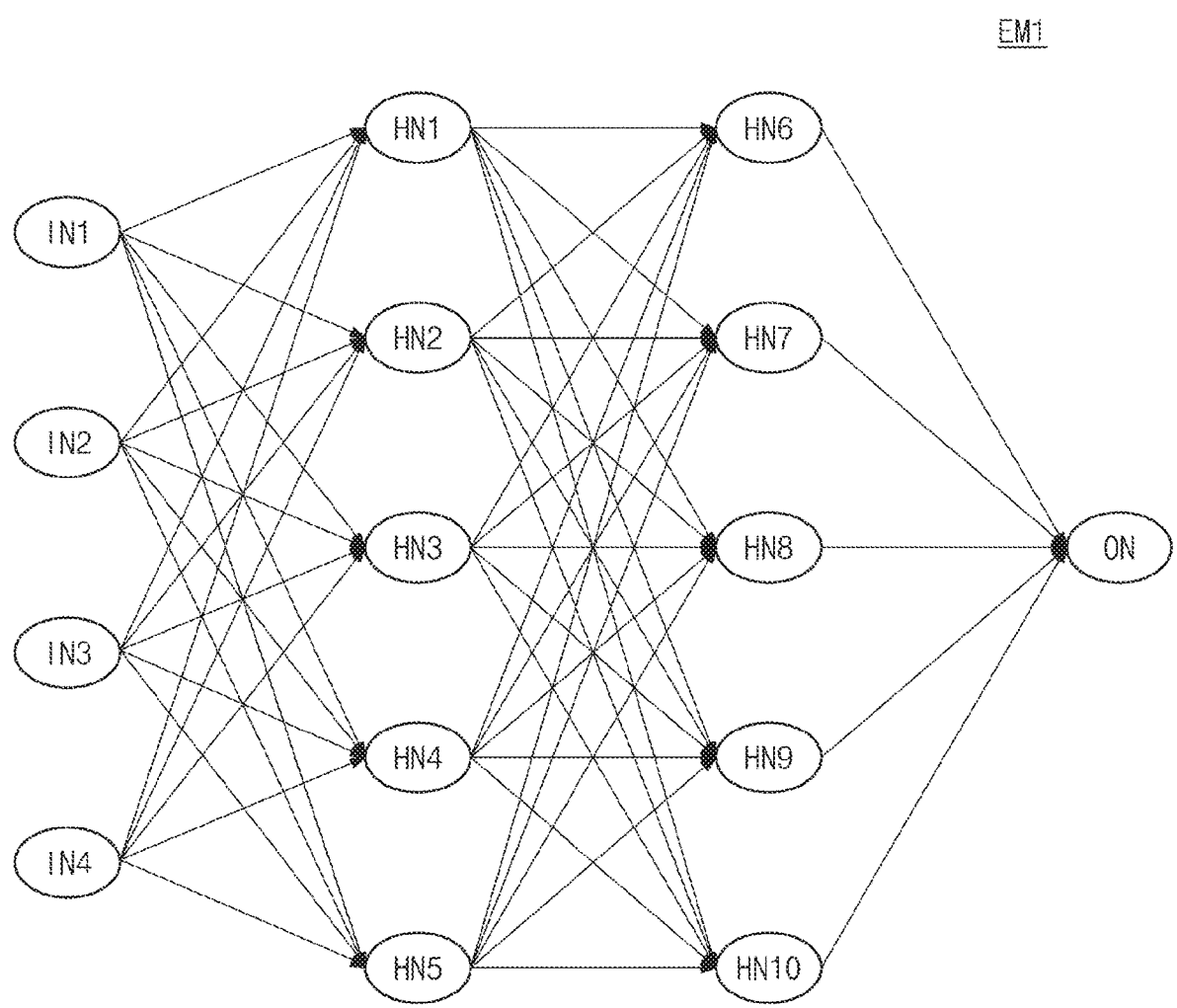
FIG. 9 is a diagram illustrating an example of a first expectation model which a machine learning core drives for the purpose of determining the expected number of errors.

FIG. 9 is a diagram illustrating an example of a first expectation model EM1 which the machine learning core 123 drives for the purpose of determining the expected number of errors.

In an exemplary embodiment, the first expectation model EM1 may be based on deep learning such as, for example, a neural network, an artificial neural network (ANN), a convolution neural network (CNN), or a recursive neural network (RNN).

Referring to FIGS. 8 and 9, the first expectation model EM1 includes first to fourth input nodes IN1 to IN4, first to tenth hidden nodes HN1 to HN10, and an output node ON. The number of input nodes, the number of hidden nodes, and the number of output nodes may be determined in advance upon constructing the neural network.

The first to fourth input nodes IN1 to IN4 form an input layer. The first to fifth hidden nodes HN1 to HN5 form a first hidden layer. The sixth to tenth hidden nodes HN6 to HN10 form a second hidden layer. The output node ON forms an output layer. The number of hidden layers may be determined in advance upon constructing the neural network, and is not limited to the number of hidden layers illustrated in FIG. 9.

Values obtained by quantifying the second device information DI2, the state information SI, and the second sample information SPI2 may be input to the first to fourth input nodes IN1 to IN4. Values of various kinds of information may be input to different input nodes. A value of each input node is transferred to the first to fifth hidden nodes HN1 to HN5 of the first hidden layer, with weights applied to the value thereof.

An input of each of the first to fifth hidden nodes HN1 to HN5 is transferred to the sixth to tenth hidden nodes HN6 to HN10 of the second hidden layer, with weights applied to the input thereof. Inputs of the sixth to tenth hidden nodes HN6 to HN10 are transferred to the output node ON, with weights applied to the inputs thereof. A value of the output node ON may indicate the number of errors expected as described above.

In the machine learning, values of the output node ON may be compared with the actual number of errors. A comparison result may be applied to the weights through back propagation. When the machine learning is completed, the weights may be fixed. The machine learning core 123 may determine the expected number of errors by using the fixed weights.

Figure 10:
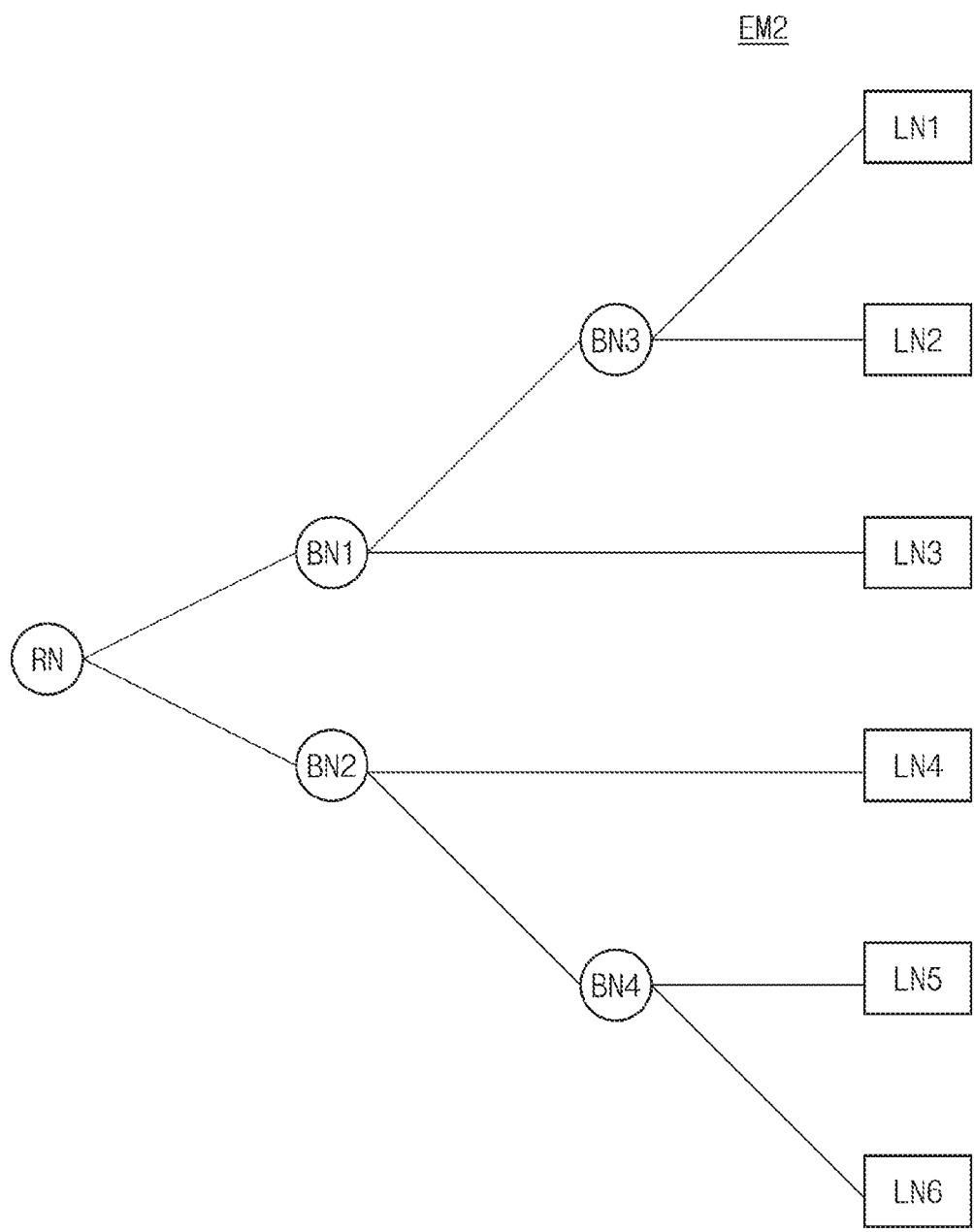
FIG. 10 is a diagram illustrating an example of a second expectation model which a machine learning core drives for the purpose of determining the expected number of errors.

FIG. 10 is a diagram illustrating an example of a second expectation model EM2 which the machine learning core 123 drives for the purpose of determining the expected number of errors.

In an exemplary embodiment, the second expectation model EM2 may be based on a decision tree. Referring to FIGS. 8 and 10, the second expectation model EM2 includes a root node RN, first to fourth branch nodes BN1 to BN4, and first to sixth leaf nodes LN1 to LN6. The root node RN, the first to fourth branch nodes BN1 to BN4, and the first to sixth leaf nodes LN1 to LN6 may be connected through branches.

In each of the root node RN, the first to fourth branch nodes BN1 to BN4, and the first to sixth leaf nodes LN1 to LN6, a comparison may be made with respect to at least one of values obtained by quantifying the second device information DI2, the state information SI, and the second sample information SPI2. One of a plurality of branches connected to each node is selected depending on a result of the comparison. In the case in which a next branch node is connected to the selected branch, a comparison may be further performed at the next branch node.

In the case in which a leaf node is connected to the selected branch, information of the leaf value may be selected. For example, values of the first to sixth leaf nodes LN1 to LN6 may indicate the expected number of errors or a range of the expected number of errors. Alternatively, the values of the first to sixth leaf nodes LN1 to LN6 may indicate the degree of reliability or the degree of deterioration of data stored in memory cells targeted for a check.

In the machine learning, a value of a selected leaf node may be compared with the actual number of errors (or the degree of reliability or the degree of deterioration). A comparison result may be applied to values (e.g., comparison values) for comparison of the first to fourth branch nodes BN1 to BN4 through back propagation. When the machine learning is completed, the comparison values may be fixed. The machine learning core 123 may determine the expected number of errors (or the degree of reliability or the degree of deterioration) by using the fixed comparison values.

Figure 11:
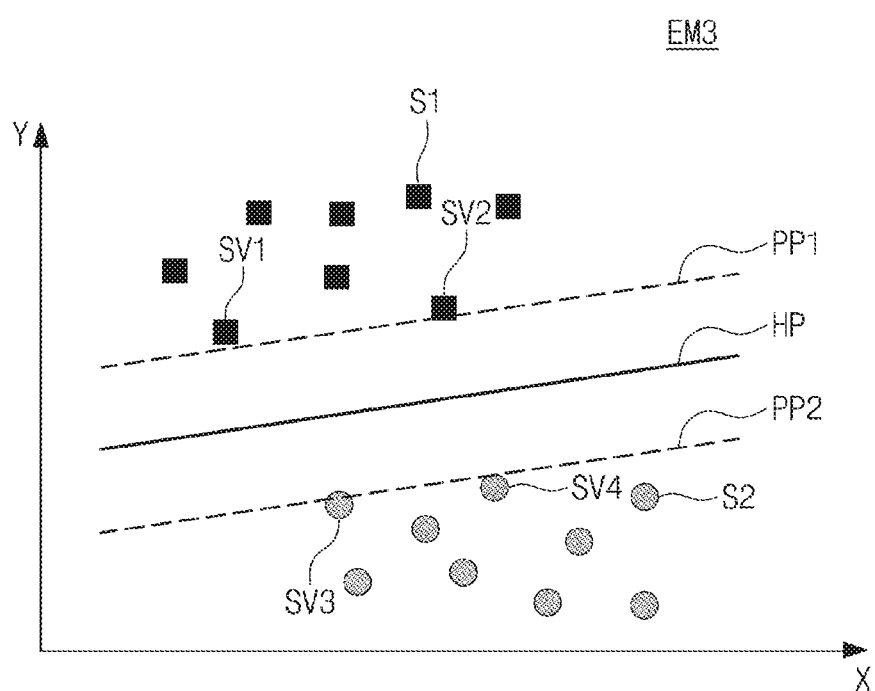
FIG. 11 is a diagram illustrating an example of a third expectation model which a machine learning core drives for the purpose of determining thee expected number of errors.

FIG. 11 is a diagram illustrating an example of a third expectation model EM3 which the machine learning core 123 drives for the purpose of determining the expected number of errors.

In an exemplary embodiment, the third expectation model EM3 may be based on a support vector machine. In FIG. 11, the horizontal axis X and the vertical axis Y indicate the second device information DI2, the state information SI, and the second sample information SPI2. For example, in the case in which a total of n information is used, the third expectation model EM3 may perform learning and expectation n-dimensionally.

Referring to FIGS. 8 and 11, in the machine learning, samples may be arranged depending on the second device information DI2, the state information SI, and the second sample information SPI2. For example, first samples S1 of a square shape may indicate samples corresponding to the case in which the number of errors corresponds to a first value, the case in which the number of errors belongs to a first range, the case in which reliability belongs to the first range, or the case in which the degree of deterioration belongs to the first range. Second samples S2 of a circular shape may indicate samples corresponding to the case in which the number of errors corresponds to a second value, the case in which the number of errors belongs to a second range, the case in which reliability belongs to the second range, or the case in which the degree of deterioration belongs to the second range.

In the machine learning, a hyperplane HP which is the most distant from the first samples S1 and are also the most distant from the second samples S2 may be determined. The hyperplane HP may be determined between a first plane PP1 defined by the first samples S1 and a second plane PP2 defined by the second samples S2.

The first samples S1 which are used to define the first plane PP1 may be a first support vector SV1 and a second support vector SV2. The second samples S2 which are used to define the second plane PP2 may be a third support vector SV3 and a fourth support vector SV4. When the machine learning is completed, the first plane PP1, the second plane PP2, and the hyperplane HP may be fixed.

In the machine learning-based check, the third expectation model EM3 may determine whether the second device information DI2, the state information SI, and the second sample information SPI2 are close to the first samples S1 or to the second samples S2 with respect to the hyperplane HP. The third expectation model EM3 may determine the number of errors, a range of errors, reliability, or the degree of deterioration depending on a determination result.

In the exemplary embodiment described with reference to FIG. 11, the third expectation model EM3 uses the hyperplane HP. However, the inventive concept is not limited thereto. For example, in an exemplary embodiment, the third expectation model EM3 may use a curve instead of the hyperplane HP. Also, the third expectation model EM3 may determine and use a plane or a curve by using three or more samples.

Figure 12:
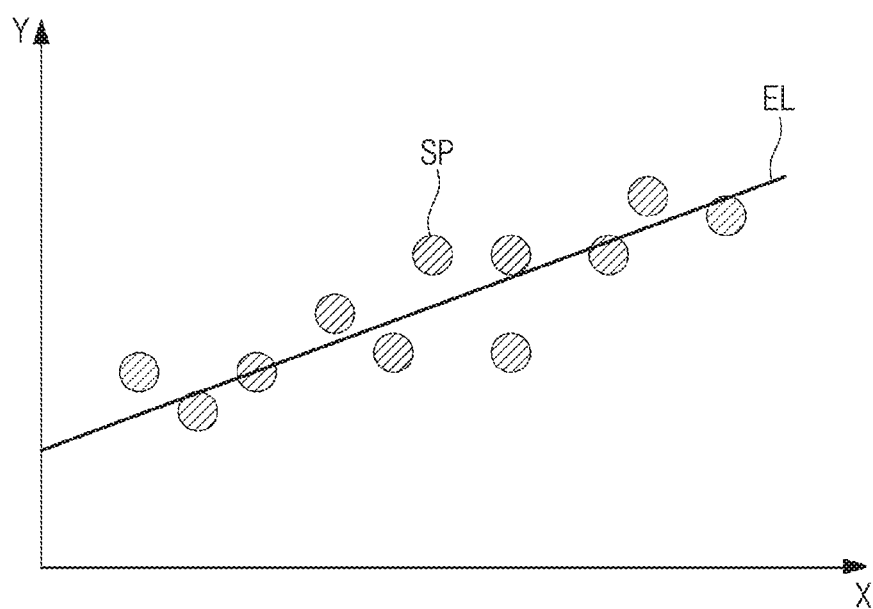
FIG. 12 is a diagram illustrating an example of a fourth expectation model which a machine learning core drives for the purpose of determining the expected number of errors.

FIG. 12 is a diagram illustrating an example of a fourth expectation model EM4 which the machine learning core 123 drives for the purpose of determining the expected number of errors.

In an exemplary embodiment, the fourth expectation model EM4 may be based on a linear regression model. In FIG. 12, the horizontal axis X indicates the second device information DI2, the state information SI, and the second sample information SPI2. The vertical axis Y indicates the expected number of errors. For example, in the case in which a total of n information is used, the fourth expectation model EM4 may perform learning and expectation (n+1)-dimensionally.

Referring to FIGS. 8 and 12, in the machine learning, samples SP may be arranged depending on the second device information DI2, the state information SI, and the second sample information SPI2. An expectation line EL following the samples SP may be generated. When the machine learning is completed, the expectation line EL following the samples SP may be fixed.

In the machine learning-based check, the fourth expectation model EM4 may obtain the number of errors of the vertical axis Y by using the second device information DI2, the state information SI, and the second sample information SPI2.

Figure 13:
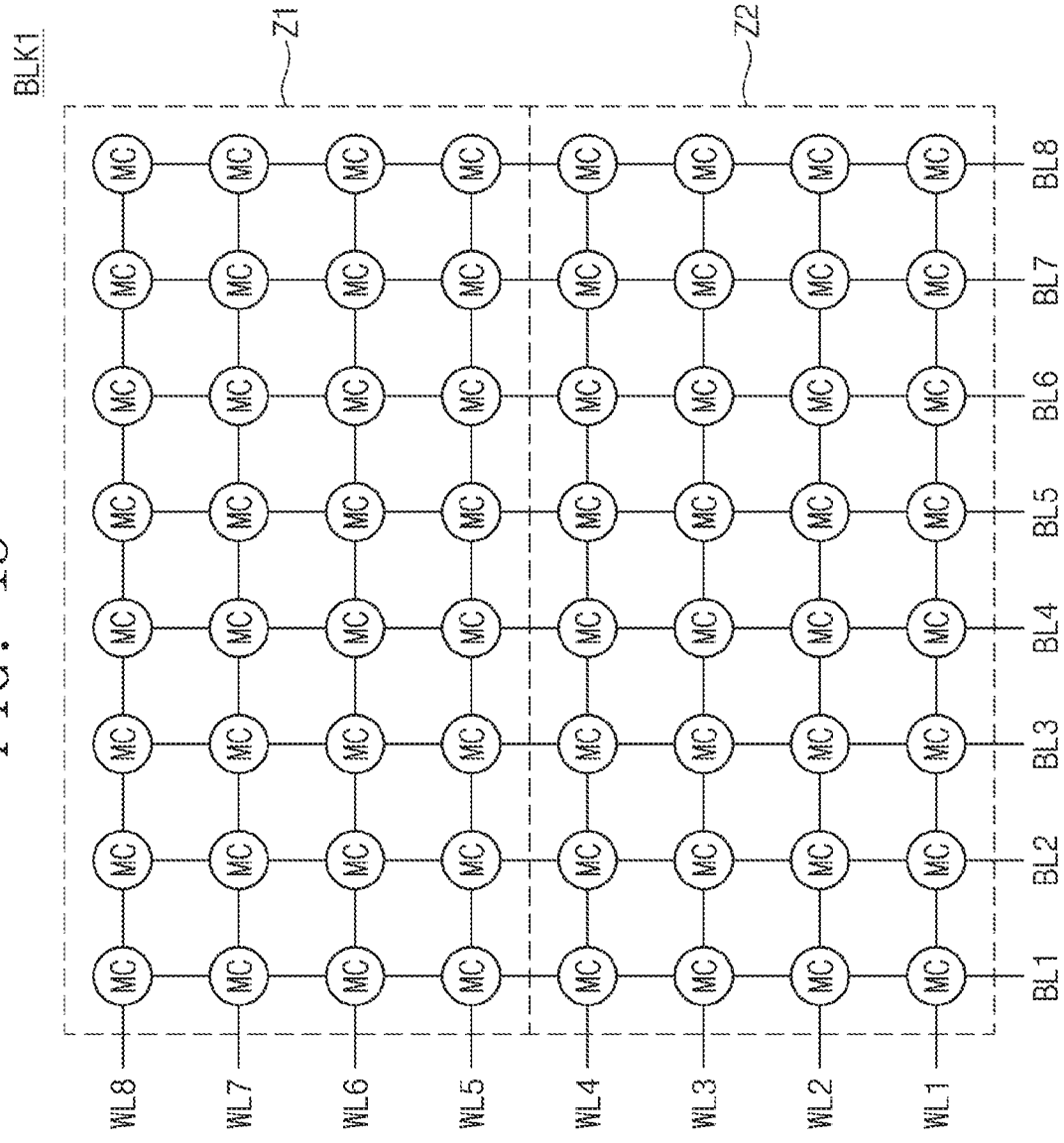
FIG. 13 is a diagram illustrating an example in which the number of expected errors of memory cells in a first memory block is determined with the memory cells divided into a first zone and a second zone.

FIG. 13 is a diagram illustrating an example in which the number of expected errors of the memory cells MC in the first memory block BLK1 is determined with the memory cells divided into a first zone Z1 and a second zone Z2.

Referring to FIGS. 1 and 13, in an exemplary embodiment, the memory cells MC may be divided into the first zone Z1 and the second zone Z2 for each group of word lines. Each of the zones may include two or more word lines. The memory cells MC may be connected to the word lines WL1 to WL8 and the bit lines BL1 to BL8. Memory cells in which the number of error bits are similarly detected in the machine learning may be grouped in the same zone.

The machine learning core 123 may determine the expected number of errors of the memory cells MC connected to the two or more word lines in the first zone Z1 in common. That is, the machine learning core 123 may determine the expected number of errors of the two or more word lines in the first zone Z1 in common. The zone for which the expected number of errors is being determined may be referred to as a check target zone. Also, the machine learning core 123 may determine the expected number of errors of the memory cells MC connected to the two or more word lines in the second zone Z2 in common. That is, the machine learning core 123 may determine the expected number of errors of the two or more word lines in the second zone Z2 in common. The size and complexity of an expectation model may decrease through the common determination of the expected number of errors.

Figure 14:
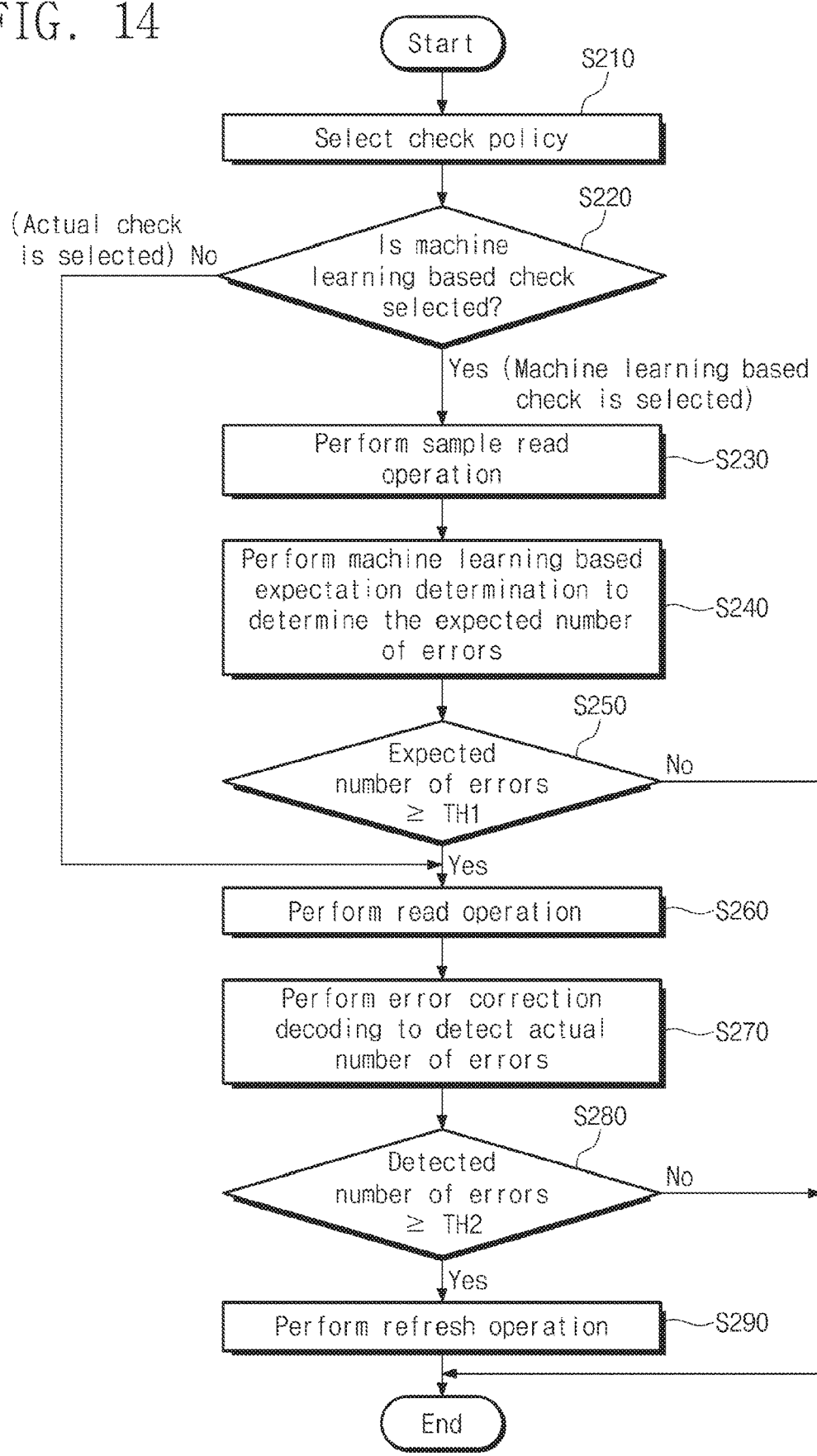
FIG. 14 is a flowchart illustrating a modified example of a check read operation according to an exemplary embodiment of the inventive concept.

FIG. 14 is a flowchart illustrating a modified example of a check read operation according to an exemplary embodiment of the inventive concept.

Referring to FIGS. 5 and 14, operation S210 and operation S220 are identical to operation S110 and operation S120 of FIG. 5.

When the machine learning-based check is performed in operation S220, in operation S230 and operation S240, the memory control core 122 may perform the machine learning-based check by using the machine learning core 123. Operation S230 and operation S240 may be identical to operation S130 and operation S140 of FIG. 5. After the number of expected errors is determined in operation S240, operation S250 is performed.

In operation S250, the memory control core 122 may determine whether the expected number of errors is equal to at least a first threshold TH1. For example, the first threshold TH1 may be set to be smaller than the number of errors which the memory interface block 126 may correct. When the expected number of errors is smaller than the first threshold TH1, the memory control core 122 may determine that the reliability of data stored in the memory cells targeted for a check is high, and may terminate the check read operation.

When the expected number of errors is not smaller than the first threshold TH1, the memory control core 122 may perform the actual check in operation S260 and operation S270. Operation S260 and operation S270 may be identical to operation S150 and operation S160 of FIG. 5. The memory control core 122 may check the reliability of data of memory cells targeted for a check more precisely by additionally performing the actual check when the expected number of errors is great enough so as not to secure the reliability of data. For example, when the expected number of errors is great enough such that it indicates that data reliability is low, the memory control core 122 may perform the actual check in addition to the machine learning-based check.

Likewise, even when the actual check is selected in operation S220, the actual check may be performed in operation S260 and operation S270. After the actual check is performed, operation S280 is performed. In operation S280, the memory control core 122 may determine whether the number of errors detected in the actual check is equal to at least a second threshold TH2. The second threshold TH2 may be set to be identical to or smaller than the number of errors which the memory interface block 126 may correct.

When the detected number of errors is smaller than the second threshold TH2, the memory control core 122 may determine that the reliability of data stored in the memory cells targeted for a check is high, and may terminate the check read operation. Alternatively, when the detected number of errors is equal to or greater than the second threshold TH2, the memory control core 122 may determine that the reliability of data stored in the memory cells targeted for a check is low. In this case, operation S290 is performed. In operation S290, the memory control core 122 may perform a refresh operation.

Figure 15:
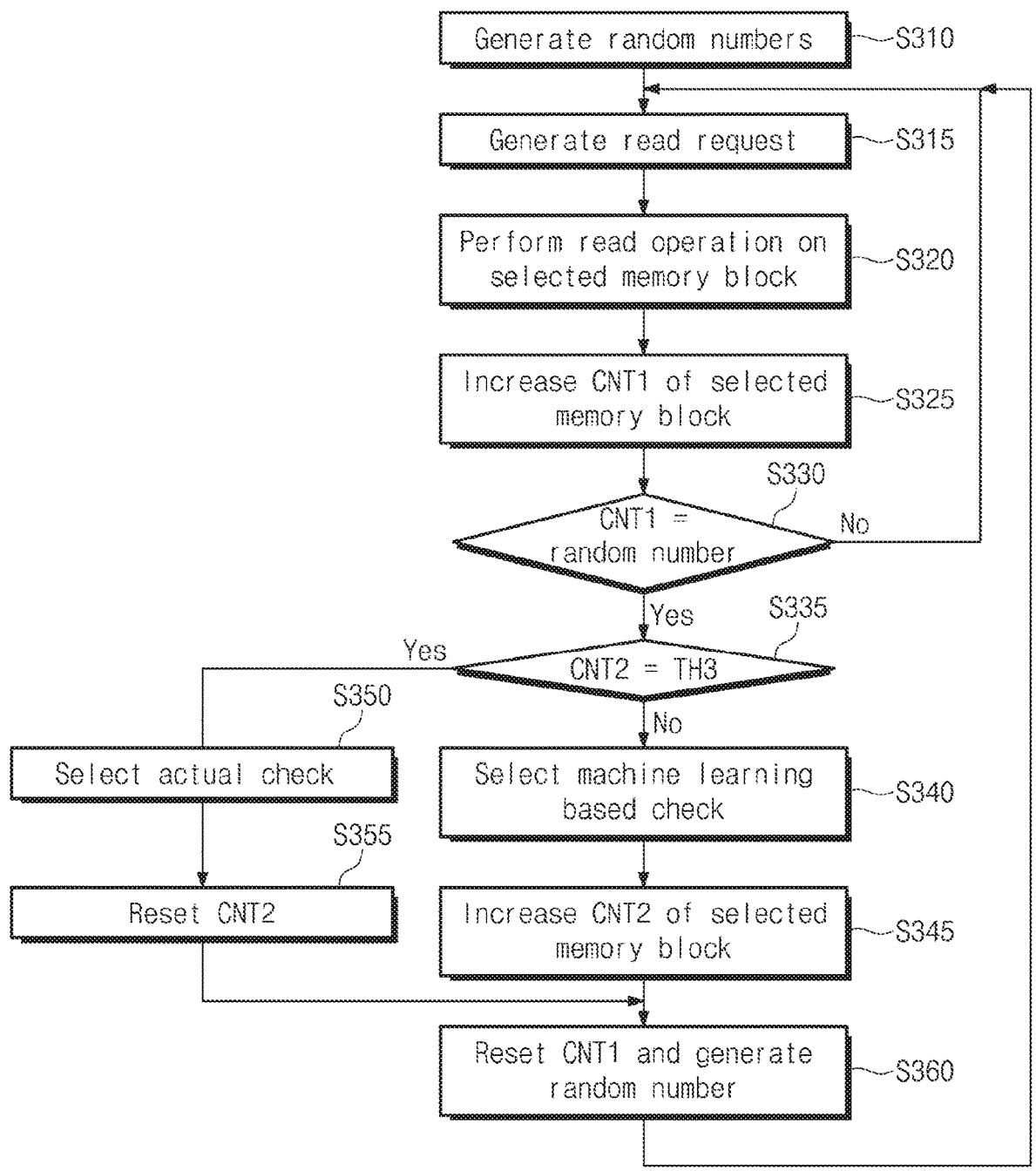
FIG. 15 is a flowchart illustrating an example of a condition in which a storage device performs a check read operation and a condition in which a storage device selects an actual check.

FIG. 15 is a flowchart illustrating an example of a condition in which the storage device 100 performs a check read operation and a condition in which the storage device 100 selects an actual check.

Referring to FIGS. 1, 2, and 15, in operation S310, the memory control core 122 may generate random numbers. For example, the memory control core 122 may generate the random numbers respectively corresponding to units of a refresh operation of the nonvolatile memory device 110, that is, the memory blocks BLK1 to BLKz.

In operation S315, the memory control core 122 may generate a read request. For example, the memory control core 122 may generate the read request depending on a request of the external host device or an internally designated schedule. The read request may include an address indicating a selected word line in a memory block selected from the memory blocks BLK1 to BLKz of the nonvolatile memory device 110.

The memory control core 122 may transmit the read request to the nonvolatile memory device 110 through the second request REQ2 and the third request REQ3. In operation S320, the nonvolatile memory device 110 may perform the read operation on memory cells connected to the selected word line of the selected memory block.

As the read operation is performed, in operation S325, the memory control core 122 may increase a first count CNT1 corresponding to the selected memory block. For example, the memory control core 122 may manage first counts respectively corresponding to the memory blocks BLK1 to BLKz of the nonvolatile memory device 110. When the read operation is performed on the selected memory block, the memory control core 122 may increase the first count CNT1 corresponding to the selected memory block. For example, the number of read operations performed on each of the memory blocks BLK1 to BLKz may be counted.

In operation S330, the memory control core 122 may determine whether the first count CNT1 of the selected memory block has reached a random number corresponding to the selected memory block. When the first count CNT1 has not reached the random number, the check read operation is not performed. The memory control core 122 may perform operation S315 to operation S325 when the following read request is generated.

When the first count CNT1 has reached the random number, the check read operation is performed. To perform the check read operation, the memory control core 122 may select a check policy (operation S110 of FIG. 5 or operation S210 of FIG. 14). In operation S335, the memory control core 122 may determine whether a second count CNT2 has reached a third threshold TH3.

For example, the memory control core 122 may manage second counts respectively corresponding to the memory blocks BLK1 to BLKz of the nonvolatile memory device 110. Upon selecting a check policy of the selected memory block, the memory control core 122 may compare the second count CNT2 of the selected memory block with the third threshold TH3.

When the second count CNT2 has not reached the third threshold TH3, in operation S340, the machine learning-based check is selected. In operation S345, the memory control core 122 may increase the second count CNT2 of the selected memory block.

When the second count CNT2 has reached the third threshold TH3, in operation S350, the actual check is selected. In operation S355, the memory control core 122 may reset the second count CNT2 (e.g., the second count CNT2 may be reset to "0").

After or before performing the check read operation described with reference to FIG. 5 or FIG. 14, in operation S360, the memory control core 122 may reset the first count CNT1. Also, the memory control core 122 may regenerate a random number corresponding to the selected memory block. The memory control core 122 may perform operation S315 to operation S325 when the following read request is generated.

In an exemplary embodiment, when the check read operation following the read operation is performed, memory cells targeted for the check read operation may be selected according to locations of memory cells selected for the read operation. For example, memory cells connected to a neighbor word line adjacent to the selected word line may be selected as a target of the check read operation.

Figure 16:
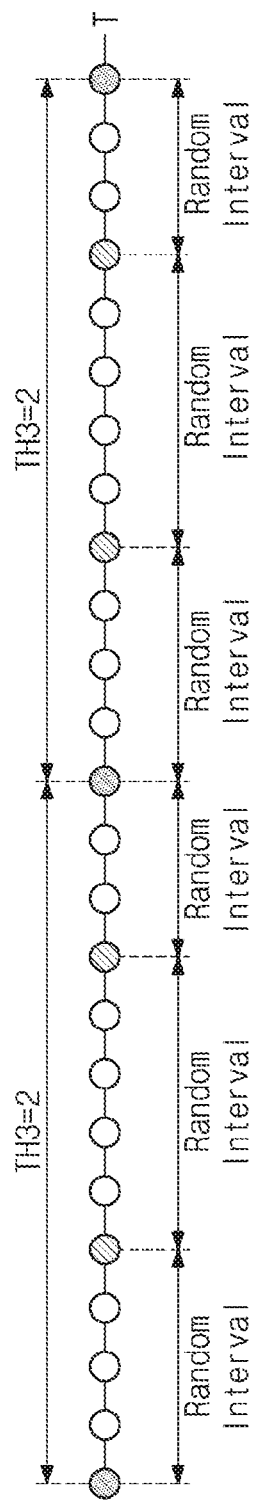
FIG. 16 is a diagram illustrating examples in which read operations and check read operations are performed depending on the method of FIG. 15.

FIG. 16 is a diagram illustrating examples in which read operations and check read operations are performed in a particular memory block depending on the method of FIG. 15.

In FIG. 16, the horizontal axis represents a time T. Also, an empty circle indicates a read operation which is performed as time T passes. A circle including oblique lines indicates the check read operation which is performed as time T elapses, and more particularly, indicates the machine learning-based check. A circle including dots indicates the check read operation which is performed as time T passes, and more particularly, indicates the actual check.

Referring to FIGS. 1, 15, and 16, the number of read operations which are performed between the check read operations with regard to a particular memory block is determined by a random number. The random number is updated when the check read operation is performed. Accordingly, an interval between the check read operations may be a random interval.

The number of machine learning-based checks which are performed between the actual checks is determined by the third threshold TH3. For example, the third threshold TH3 may be set to 2. Accordingly, in the check read operations, the actual check may be performed periodically at an interval of the third threshold TH3.

As described with reference to FIG. 15, the check read operation is performed on memory cells connected to a neighbor word line adjacent to a selected word line of an immediately previously performed read operation. Accordingly, the check read operation according to an exemplary embodiment of the inventive concept may be called a "random interval neighbor check (RINC)".

Figure 17:
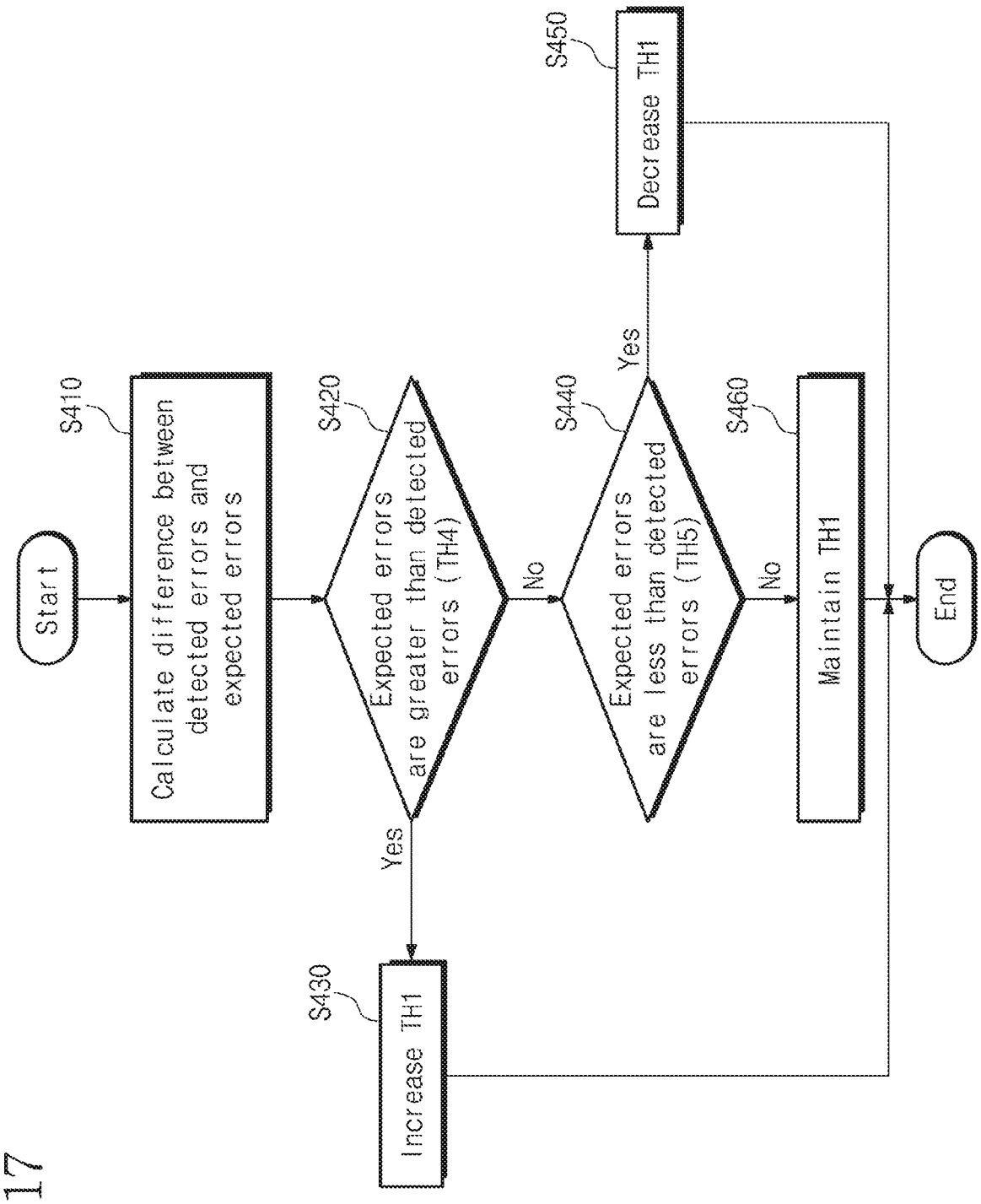
FIG. 17 is a flowchart illustrating an example of a method of adaptively controlling a check read operation according to an exemplary embodiment of the inventive concept.

FIG. 17 is a flowchart illustrating an example of a method of adaptively controlling a check read operation according to an exemplary embodiment of the inventive concept.

Referring to FIGS. 1, 14, and 17, in operation S410, the memory control core 122 may calculate a difference between errors detected in the actual check and errors expected in the machine learning-based check, for example, a difference between the detected number of errors and the expected number of errors.

As described with reference to FIG. 14, when the number of errors expected from memory cells targeted for a check is not smaller than the first threshold TH1, the actual check is performed on the memory cells targeted for a check, and the number of errors is detected. Accordingly, a difference between the detected number of errors and the expected number of errors may be calculated with regard to the memory cells targeted for a check.

In an exemplary embodiment, when the actual check is selected as a check policy (refer to operation S110 of FIG. 5 or operation S210 of FIG. 14), the memory control core 122 may direct the machine learning core 123 to perform the machine learning-based check on the memory cells targeted for a check. The memory control core 122 may obtain the detected number of errors and the expected number of errors and may calculate a difference.

In operation S420, the memory control core 122 may determine whether the expected number of errors is greater than the detected number of errors. For example, the memory control core 122 may determine whether the expected number of errors is greater than the detected number of errors by as much as at least a fourth threshold TH4. The fourth threshold TH4 may be set to a particular ratio (e.g., 10% or 20%) of the number of errors which the memory interface block 126 may correct.

When the expected number of errors is greater than the detected number of errors by as much as at least the fourth threshold TH4, the memory control core 122 may determine that the number of errors is excessively expected by the machine learning-based check. By increasing the first threshold TH1 in operation S430, the memory control core 122 may elevate a condition for verifying the machine learning-based check with the actual check. Afterwards, the update of the first threshold TH1 is terminated.

When the expected number of errors is not greater than the detected number of errors by as much as at least the fourth threshold TH4, operation S440 is performed. In operation S440, the memory control core 122 may determine whether the expected number of errors is smaller than the detected number of errors. For example, the memory control core 122 may determine whether the expected number of errors is greater than the detected number of errors by as much as at least a fifth threshold TH5. The fifth threshold TH5 may be set to a particular ratio (e.g., 10% or 20%) of the number of errors which the memory interface block 126 may correct.

When the expected number of errors is smaller than the detected number of errors by as much as at least the fifth threshold TH5, the memory control core 122 may determine that the number of errors is expected to be too small by the machine learning-based check. By decreasing the first threshold TH1 in operation S450, the memory control core 122 may lower a condition for verifying the machine learning-based check with the actual check. Afterwards, the update of the first threshold TH1 is terminated.

When the expected number of errors is not smaller than the detected number of errors by as much as at least the fifth threshold TH5, operation S460 is performed. In operation S460, the memory control core 122 may maintain the first threshold TH1. Afterwards, the update of the first threshold TH1 is terminated.

As described with reference to FIG. 17, the memory control core 122 may apply the reliability of expectation of the machine learning core 123 to adjust the first threshold TH1. That is, an expectation error of the machine learning core 123 may be compensated by updating the first threshold TH1.

Figure 18:
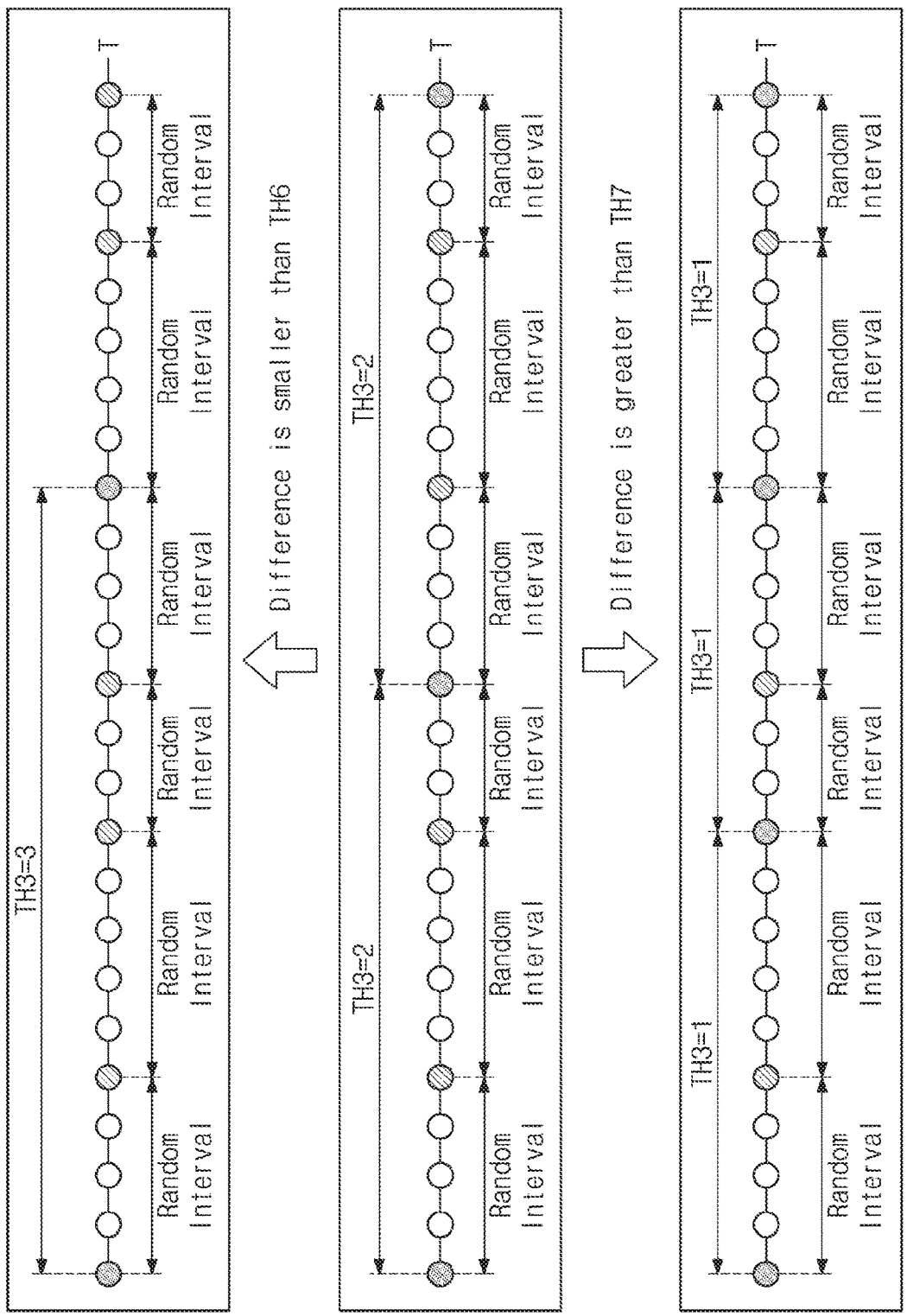
FIG. 18 is a diagram illustrating an example of a method of adaptively controlling a check read operation according to an exemplary embodiment of the inventive concept.

FIG. 18 is a diagram illustrating an example of a method of adaptively controlling a check read operation according to an exemplary embodiment of the inventive concept.

In FIG. 18, the horizontal axis represents a time T. Also, an empty circle indicates a read operation which is performed as time T passes. A circle including oblique lines indicates the check read operation which is performed as time T elapses, and more particularly, indicates the machine learning-based check. A circle including dots indicates the check read operation which is performed as time T passes, and more particularly, indicates the actual check.

Referring to FIGS. 1, 17, and 18, the memory control core 122 may calculate a difference (e.g., an absolute value of a difference) between the expected number of errors and the detected number of errors (refer to operation S410 of FIG. 17).

When the calculated difference is smaller than a sixth threshold TH6, the memory control core 122 may determine that the reliability of the machine learning-based check is high, and may increase the third threshold TH3. For example, the third threshold TH3 may increase from 2 to 3. That is, the frequency of execution of the actual check decreases. The sixth threshold TH6 may be set to a particular ratio (e.g., 5% or 10%) of the number of errors which the memory interface block 126 may correct.

When the calculated difference is smaller than a seventh threshold TH7, the memory control core 122 may determine that the reliability of the machine learning-based check is low, and may decrease the third threshold TH3. For example, the third threshold TH3 may decrease from 2 to 1. That is, the frequency of execution of the actual check increases. The seventh threshold TH7 may be set to a particular ratio (e.g., 10% or 20%) of the number of errors which the memory interface block 126 may correct.

Figure 19:
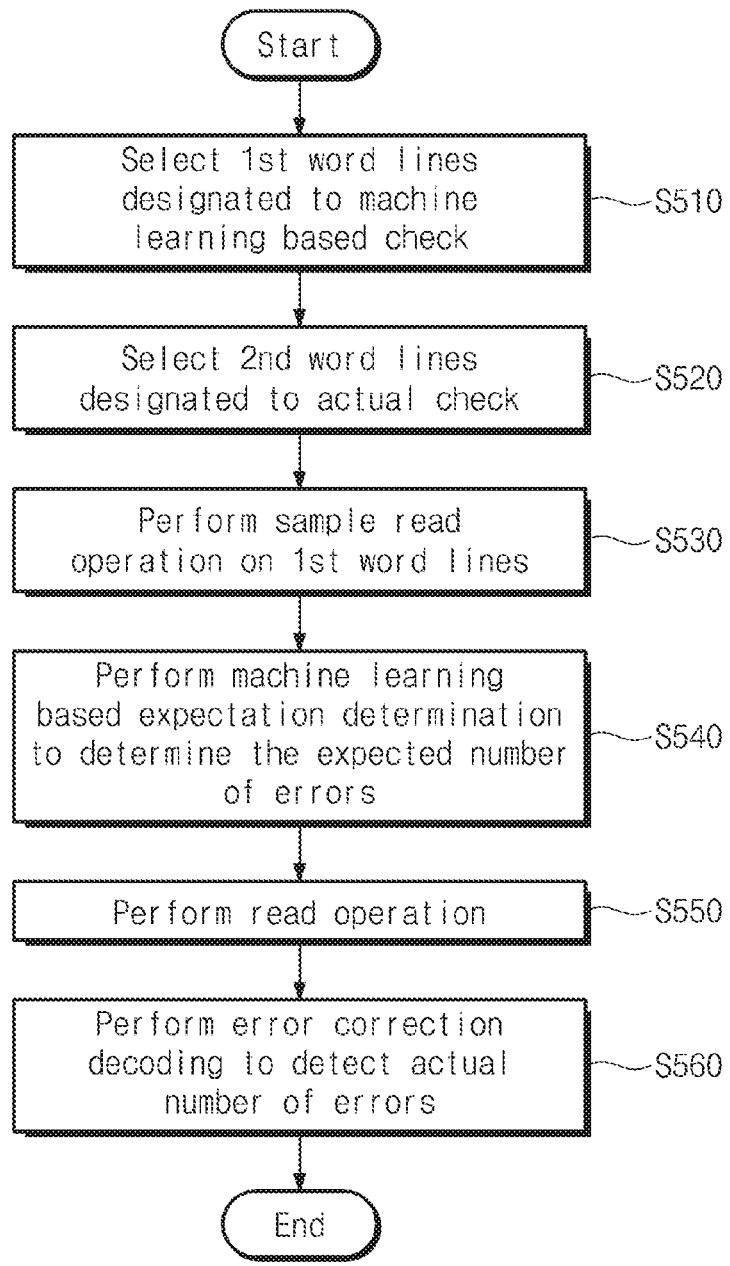
FIG. 19 is a flowchart illustrating an example in which a machine learning-based check and an actual check are simultaneously performed.

FIG. 19 is a flowchart illustrating an example in which a machine learning-based check and an actual check are simultaneously performed.

Referring to FIGS. 1 and 19, in operation S510, the memory control core 122 may select a first word line assigned to the machine learning-based check. For example, the memory control core 122 may select a part of neighbor word lines adjacent to a selected word line where the read operation is performed as first word lines.

In operation S520, the memory control core 122 may select second word lines assigned to the actual check. For example, the memory control core 122 may select the rest of the neighbor word lines adjacent to the selected word line where the read operation is performed as the second word lines.

In operation S530, the memory control core 122 may request the nonvolatile memory device 110 to perform the sample read operation on memory cells connected to the first word lines. Afterwards, the memory control core 122 may request the machine learning core 123 to perform the machine learning-based check on memory cells connected to the first word lines.

In operation S540, the machine learning core 123 may determine the expected number of errors by performing the machine learning-based expectation determination on the memory cells connected to the first word lines. The machine learning core 123 may provide the expected number of errors to the memory control core 122.

In operation S550, the memory control core 122 may request the nonvolatile memory device 110 to perform the read operation on memory cells connected to the second word lines. In operation S560, the memory interface block 126 may detect the actual number of errors by performing error correction decoding on data read from the nonvolatile memory device 110.

As described with reference to FIG. 13, the machine learning-based check may be performed for each zone corresponding to a group of word lines. As described with reference to FIG. 14, when the expected number of errors is not smaller than the first threshold TH1, the actual check may be further performed on the memory cells on which the machine learning-based check is performed.

As described with reference to FIG. 14, when the number of errors detected in the actual check is not smaller than the second threshold TH2, the refresh operation may be performed on selected memory cells targeted for the check read operation.

As described with reference to FIGS. 15 and 16, the check read operation may be performed at a random interval. As described with reference to FIG. 17, the memory control core 122 may adjust the first threshold TH1 depending on a difference between the expected number of errors and the detected number of errors.

Also, the memory control core 122 may adjust a ratio of the number of first word lines and the number of second word lines depending on the difference between the expected number of errors and the detected number of errors. For example, when the difference (e.g., an absolute value of the difference) is smaller than a particular threshold, the memory control core 122 may increase the number of first word lines and may decrease the number of second word lines.

When the difference (e.g., an absolute value of the difference) is greater than a particular different threshold, the memory control core 122 may decrease the number of first word lines and may increase the number of second word lines.

In the above-described exemplary embodiments, components according to exemplary embodiments of the inventive concept are described using blocks. The blocks may be implemented with various hardware devices, such as an integrated circuit, an application specific integrated circuit (ASIC), a field programmable gate array (FPGA), a complex programmable logic device (CPLD), firmware driven in hardware devices, software such as an application, or a combination of a hardware device and software. Also, the blocks may include circuits or intellectual property (IP) blocks implemented with semiconductor elements in an integrated circuit.

As is traditional in the field of the inventive concept, exemplary embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, etc., which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions.

According to exemplary embodiments of the inventive concept, a reliability check is performed by combining a machine learning-based check that takes a relatively short amount of time compared to an actual check, and the actual check that takes a relatively long amount of time compared to the machine learning-based check. By combining the machine learning-based check with the actual check, an improved storage device that more accurately and efficiently detects errors, and an improved method of operating such a storage device, are provided. Accordingly, a storage device that may perform the reliability check during a reduced amount of time and an operating method of the storage device are provided.

While the inventive concept has been particularly shown and described with reference to the exemplary embodiments thereof, it will be understood by those of ordinary skill in the art that various changes in form and detail may be made therein without departing from the spirit and scope of the inventive concept as set forth in the following claims.

What is claimed is:

1. A storage device, comprising:
a nonvolatile memory device comprising a plurality of memory blocks, wherein each memory block comprises a plurality of memory cells connected to a plurality of word lines; and
a controller configured to perform a first read operation on memory cells connected to a selected word line included in a selected memory block based on a request of an external host device,
wherein the controller is further configured to perform a check read operation that checks a reliability of the memory cells of the selected memory block after performing the first read operation,
wherein, in the check read operation, the controller is further configured to select and perform one of an actual check and a machine learning-based check.

2. The storage device of claim 1, wherein, when the actual check is selected, the controller performs a second read operation on memory cells connected to a check target word line in the selected memory block, and counts a number of errors by performing error correction decoding on a result of the second read operation.

3. The storage device of claim 1, wherein, when the machine learning-based check is selected, the controller is configured to perform a sample read operation on memory cells connected to a check target word line in the selected memory block, and to determine an expected number of errors based on machine learning by using a result of the sample read operation and information of the storage device.

4. The storage device of claim 3, wherein the information of the storage device comprises at least one of a location of the nonvolatile memory device on a wafer, an address of the selected memory block, a number of times that an erase operation is performed on the selected memory block, an address of the check target word line, a time that elapses after the memory cells connected to the check target word line are programmed, a number of read operations previously performed on the selected memory block, a duration that the selected memory block is left alone in an erase state before the selected memory block is programmed, a current temperature, and a current humidity.

5. The storage device of claim 1, wherein the machine learning-based check uses a model which is generated based on at least one of a neural network, a decision tree, a support vector machine, and a linear regression model.

6. The storage device of claim 1, wherein the word lines of the selected memory block are divided into a plurality of zones, and each zone comprises two or more word lines,
wherein, when the machine learning-based check is selected, the controller determines an expected number of errors of the two or more word lines in a check target zone in common.

7. The storage device of claim 1, wherein, when the machine learning-based check is selected, the controller determines an expected number of errors of memory cells connected to a check target word line in the selected memory block based on machine learning,
wherein, when the expected number of errors is equal to at least a first threshold value, the controller is configured to further determine an actual number of errors by performing the actual check on the check target word line.

8. The storage device of claim 7, wherein, when the number of actual errors detected through the actual check is equal to at least a second threshold value, the controller further performs a refresh operation on the selected memory block.

9. The storage device of claim 7, wherein the controller adjusts the first threshold value based on a difference between the actual number of errors detected in the actual check and the expected number of errors determined in the machine learning-based check.

10. The storage device of claim 1, wherein the controller is further configured to:
generate a plurality of random numbers respectively corresponding to the memory blocks;
count a number of read operations performed on each of the memory blocks; and
perform the check read operation on the selected memory block when the number of read operations of the selected memory block reaches a random number corresponding to the selected memory block.

11. The storage device of claim 10, wherein, when the check read operation is performed, the controller resets the number of read operations of the selected memory block and regenerates the random number corresponding to the selected memory block.

12. The storage device of claim 10, wherein the controller counts the number of check read operations performed on the selected memory block, selects the machine learning-based check when the number of check read operations is smaller than a threshold value, and select the actual check when the number of check read operations reaches the threshold value.

13. The storage device of claim 12, wherein, when the actual check is selected with regard to the selected memory block, the controller resets the number of check read operations of the selected memory block.

14. The storage device of claim 12, wherein the controller adjusts the threshold value based on a difference between a number of actual errors detected in the actual check and a number of expected errors determined in the machine learning-based check.

15. A storage device, comprising:
a nonvolatile memory device comprising a plurality of memory blocks, wherein each memory block comprises a plurality of memory cells connected to a plurality of word lines; and
a controller configured to perform a read operation on memory cells connected to a selected word line included in a selected memory block based on a request of an external host device,
wherein the controller is further configured to perform a check read operation that checks a reliability of the memory cells of the selected memory block after performing the read operation,
wherein, in the check read operation, the controller performs an actual check on first check target word lines in the selected memory block and performs a machine learning-based check on second check target word lines in the selected memory block.

16. The storage device of claim 15, wherein, when a number of expected errors with regard to one of the second check target word lines is equal to at least a threshold value, the controller is configured to further perform the actual check on the one second check target word line.

17. The storage device of claim 16, wherein the controller is further configured to adjust a number of the first check target word lines and a number of the second check target word lines based on the number of expected errors from the one second check target word line and a number of actual errors detected from the one second check target word line through the actual check.

18. An operating method of a storage device, comprising:
    selecting a word line of a memory block from a plurality of memory blocks included in a nonvolatile memory device;
    performing, at a controller configured to control the nonvolatile memory device, a read operation on a plurality of memory cells connected to the selected word line; and
    performing, at the controller, a check read operation on memory cells connected to at least one check target word line of the memory block connected to the selected word line in response to the read operation,
    wherein the check read operation combines an actual check and a machine learning-based check on the memory cells connected to the at least one check target word line.

19. The method of claim 18, wherein the check read operation comprises:
    performing the machine learning-based check on the memory cells connected to the at least one check target word line; and
    performing the actual check on the memory cells connected to the at least one check target word line when a number of expected errors in the machine learning-based check is equal to at least a threshold value.

20. The method of claim 18, wherein the at least one check target word line comprises a first check target word line and a second check target word line,
    wherein the check read operation comprises:
    performing the actual check on the first check target word line; and
    performing the machine learning-based check on the second check target word line.

* * * * *